(12) United States Patent
Liang et al.

(10) Patent No.: US 11,710,781 B2
(45) Date of Patent: Jul. 25, 2023

(54) GROWTH PROCESS AND METHODS THEREOF

(71) Applicant: Taiwan Semiconductor Manufacturing Co., Ltd., Hsinchu (TW)

(72) Inventors: Pin Chu Liang, Changhua (TW); Hung-Yao Chen, Hsinchu (TW); Pei-Ren Jeng, Chu-Bei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/460,699

(22) Filed: Aug. 30, 2021

(65) Prior Publication Data

US 2023/0064078 A1 Mar. 2, 2023

(51) Int. Cl.
*H01L 21/02* (2006.01)
*H01L 29/66* (2006.01)
*H01L 21/027* (2006.01)
*H01L 29/78* (2006.01)

(52) U.S. Cl.
CPC ...... *H01L 29/6681* (2013.01); *H01L 21/0274* (2013.01); *H01L 21/02532* (2013.01); *H01L 29/66636* (2013.01); *H01L 29/7855* (2013.01)

(58) Field of Classification Search
None
See application file for complete search history.

(56) References Cited

U.S. PATENT DOCUMENTS

| | | | |
|---|---|---|---|
| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,116 | B2 | 3/2017 | Ching et al. |
| 9,812,363 | B1 | 11/2017 | Liao et al. |
| 9,859,380 | B2 | 1/2018 | Lee et al. |
| 2023/0064078 | A1* | 3/2023 | Liang ............... H01L 29/6681 |

* cited by examiner

*Primary Examiner* — Jack S Chen
(74) *Attorney, Agent, or Firm* — Slater Matsil, LLP

(57) ABSTRACT

A method includes depositing a first dielectric layer over and along sidewalls of a first semiconductor fin and a second semiconductor fin, depositing a second dielectric layer over the first dielectric layer, recessing the first dielectric layer to define a dummy fin between the first semiconductor fin and the second semiconductor fin, forming a cap layer over top surfaces and sidewalls of the first semiconductor fin and the second semiconductor fin, wherein the forming the cap layer comprises depositing the cap layer in a furnace at process temperatures higher than a first temperature, and lowering the temperature of the furnace, wherein during the lowering the temperature of the furnace, the pressure in the furnace is raised to and maintained at 10 torr or higher until the temperature of the furnace drops below the first temperature.

20 Claims, 26 Drawing Sheets

GROWTH PROCESS AND METHODS THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
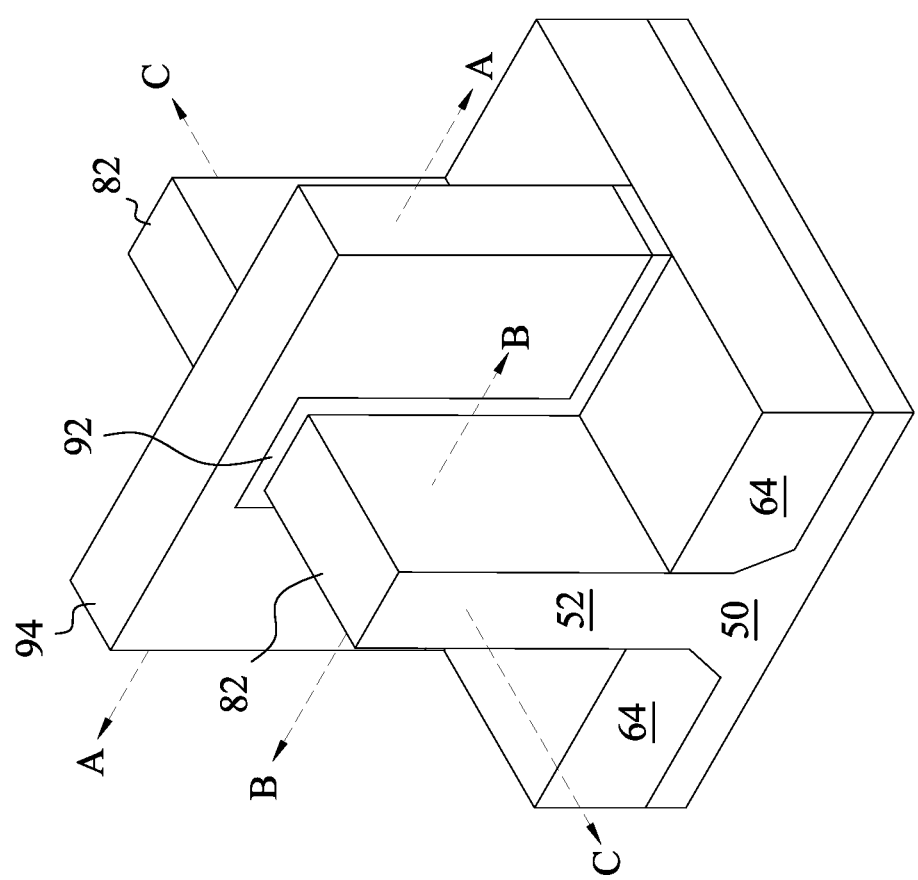
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include methods applied to, but not limited to the formation of a silicon cap layer over a semiconductor fin at a first process temperature, followed by a ramp down of the first process temperature after the formation of the silicon cap layer. Embodiments disclosed herein include a ramping down of the first process temperature at relatively high pressures. For example, when the first process temperature is above 400° C., at least a first portion of the ramp down after the formation of the silicon cap layer is performed at pressures of 0.1 torr or higher, and a second portion of the ramp down is performed at pressures of 10 torr or higher. As a result, defects may be reduced. For example, a number of silicon islands or ball type defects formed on dielectric films, dummy fins, and shallow trench isolation (STI) regions surrounding the semiconductor fin can be reduced, and a more uniform silicon growth can be achieved. In addition, the diameter of the ball type defects formed can be reduced. Accordingly, fin morphology is improved, and the risk of performance degradation is lowered.

FIG. 1 illustrates an example of a FinFET in a three-dimensional view, in accordance with some embodiments. The FinFET comprises a fin 52 on a substrate 50 (e.g., a semiconductor substrate). Isolation regions 64 are disposed in the substrate 50, and the fin 52 protrudes above and from between neighboring isolation regions 64. Although the isolation regions 64 are described/illustrated as being separate from the substrate 50, as used herein the term "substrate" may be used to refer to just the semiconductor substrate or a semiconductor substrate inclusive of isolation regions. A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example perpendicular to the direction of current flow between the source/drain regions 82 of the FinFET. Cross-section B-B is parallel to cross-section A-A and extends through a source/drain region of the FinFET. Cross-section C-C is perpendicular to cross-section A-A and is along a longitudinal axis of the fin 52 and in a direction of, for example, a current flow between the source/drain regions 82 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2, 3, 4, 5, 6, 7A, 7B, 8, 9A, 9D, 9F, 10A, 10B, 11A, 11B, 12A, 12B, 13A, 13B, 13C, 13D, 14A, 14B, 15A, 15B, 16A, 16B, 17A, 17B, 18A, and 18B are cross-sectional views of intermediate stages in the manufacturing of Fin-FETs, in accordance with some embodiments. FIGS. 2 through 8 illustrate reference cross-section A-A illustrated in FIG. 1, except for multiple fins/FinFETs. FIGS. 9A, 9D, 9F, 10A, 11A, 12A, 13A, 14A, 15A, 16A, 17A and 18A are illustrated along reference cross-section A-A illustrated in FIG. 1, and FIGS. 10B, 11B, 12B, 13B, 14B, 15B, 16B, 17B and 18B are illustrated along a similar cross-section C-C illustrated in FIG. 1, except for multiple fins/FinFETs. FIGS. 13C and 13D are illustrated along reference cross-section B-B illustrated in FIG. 1, except for multiple fins/FinFETs.

Figure 2:
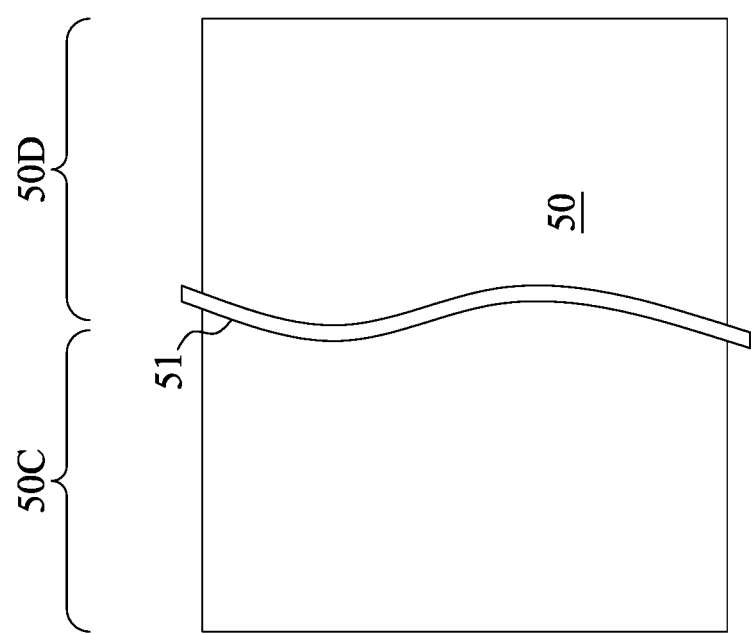
FIGS. 2, 3, 4, 5, 6, 7A, 7B, and 8 are cross-sectional views of intermediate stages in the manufacturing of FinFETs, in accordance with some embodiments.

FIG. 2 illustrates a substrate 50. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50C and a region 50D. The region 50C can be for forming n-type devices, such as NMOS transistors, e.g., n-type FinFETs. The region 50D can be for forming p-type devices, such as PMOS transistors, e.g., p-type FinFETs. In other embodiments, the region 50C can be for forming p-type devices, such as PMOS transistors, e.g., p-type FinFETs. The region 50D can be for forming n-type devices, such as NMOS transistors, e.g., n-type FinFETs. The region 50C may be physically separated from the region 50D (as illustrated by divider 51), and any number of device features (e.g., other active devices, doped regions, isolation structures, etc.) may be disposed between the region 50C and the region 50D. In some embodiments, both the region 50C and the region 50D are used to form the same type of devices, such as both regions being for n-type devices or p-type devices. In subsequent description, only one region (e.g., either region 50C or 50D) is illustrated and any differences in forming different features in the other regions are described.

Figure 3:
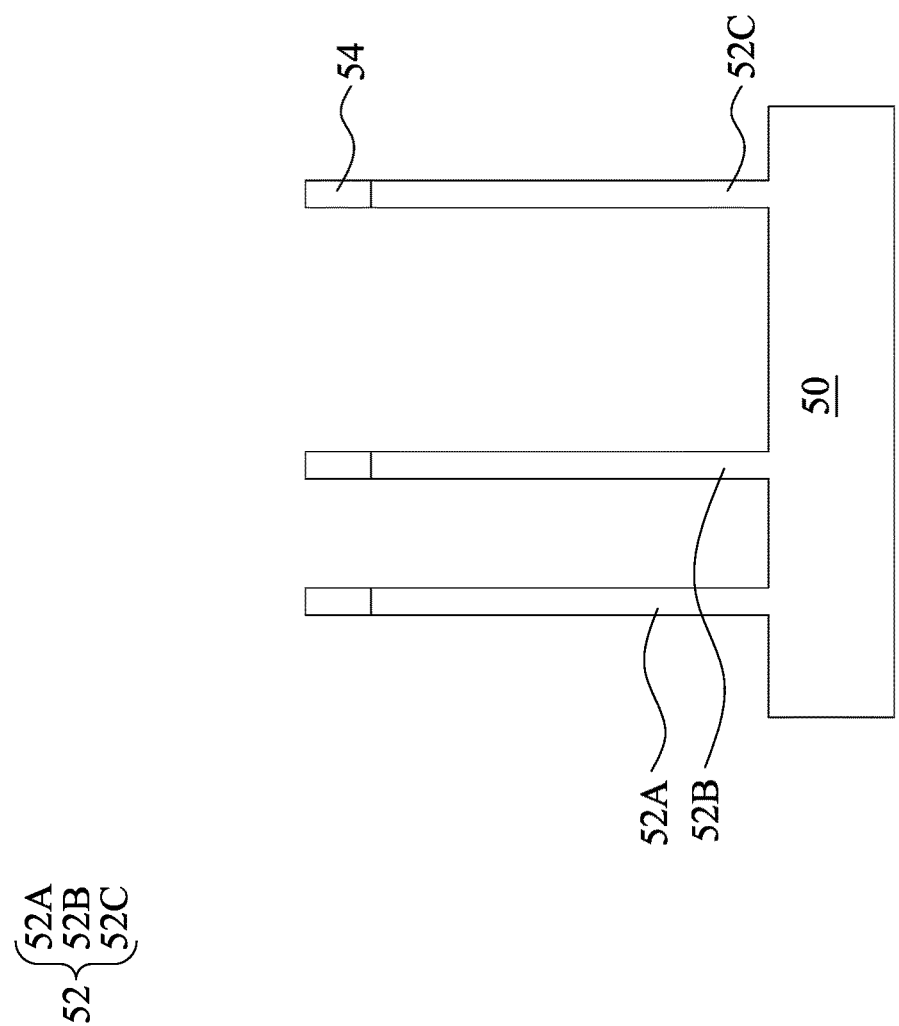

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. In such embodiment, a mask layer 54 may be used to define a pattern of the fins 52. In some embodiments, the mask layer 54 may comprise silicon oxide, silicon nitride, silicon oxynitride, or the like. In some embodiments, the mask layer 54 comprises multiple sub-layers, such as a sub-layer of silicon nitride over a sub-layer of silicon oxide.

The fins include fins 52A, 52B, and 52C. The Fins 52A and 52B are spaced apart from each other by a first distance while the fins 52B and 52C are spaced apart from each other by a second distance. The first distance is less than the second distance.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, it may be advantageous to epitaxially grow a material in an NMOS region different from the material in a PMOS region. In various embodiments, the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. In some embodiments, the fins 52 in a PMOS region may be formed from silicon germanium, and the fins 52 in an NMOS region may be formed from silicon.

Figure 4:
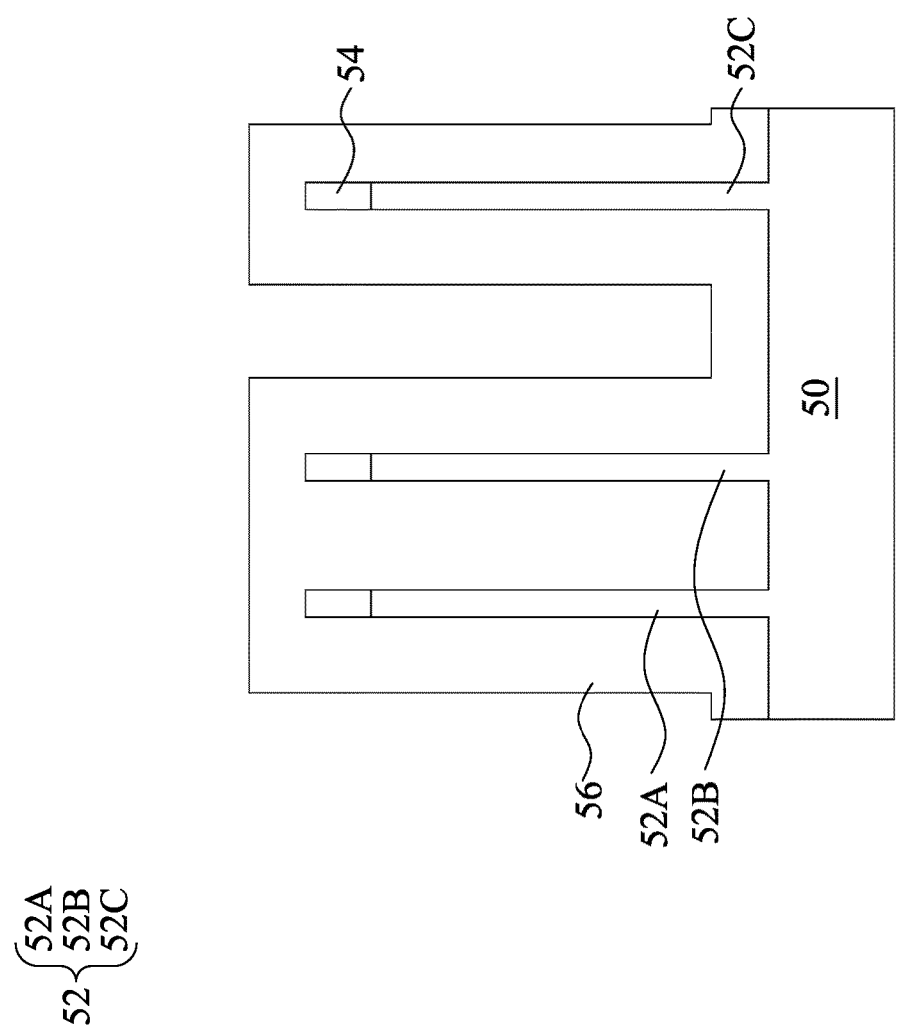

In FIG. 4, a dielectric layer 56 is deposited over and along sidewalls of the fins 52. The dielectric layer 56 may further extend along top surfaces of the fins 52 and top surfaces of the substrate 50 between the fins 52. The dielectric layer 56 may fill or overfill areas between some of the fins 52 (e.g., between the fins 52A and 52B) while other areas between the fins 52 may only be partially filled (e.g., between fins 52B and 52C). The deposition of the dielectric layer 56 may be performed using a conformal deposition process, such as, chemical vapor deposition (CVD), atomic layer deposition (ALD), or the like. The dielectric layer 56 may comprise any suitable insulating material, such as, silicon oxide, or the like.

Figure 5:
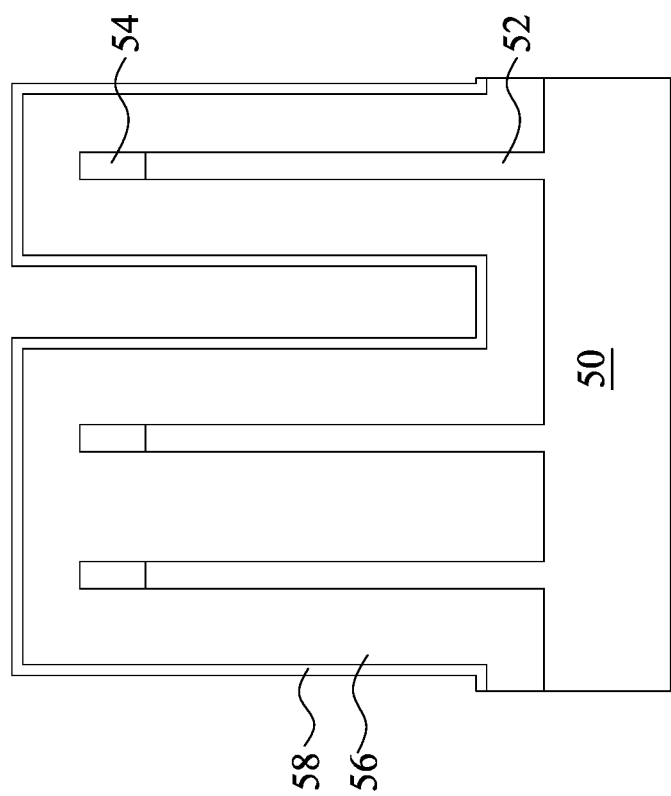

In FIG. 5, a dielectric layer 58 is deposited over the dielectric layer 56 such that the dielectric layer 58 is disposed along sidewalls and top surfaces of the dielectric layer 56. The deposition of the dielectric layer 58 may be performed using a conformal deposition process, such as, CVD, ALD, or the like. The dielectric layer 58 may comprise a carbon-containing dielectric film (e.g., a carbon-containing nitride, such as, SiCN or a carbon-containing oxide, such as, SiOC), a metal-containing dielectric film (e.g., a metal-containing oxide, such as, a combination of SiO and a metal), combinations thereof, or the like.

Figure 6:
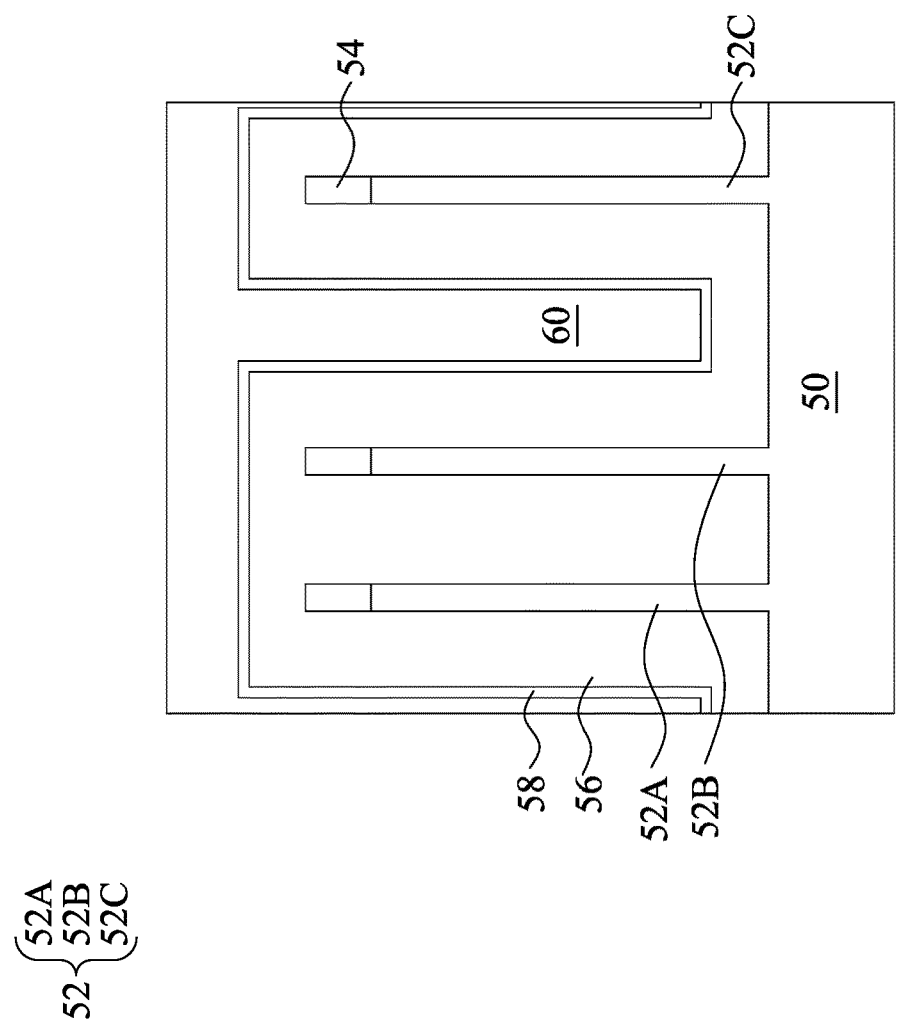

In FIG. 6, a dielectric layer 60 is deposited over the dielectric layer 56 and the dielectric layer 58. The dielectric layer 60 may be deposited between some of the fins 52 to fill or overfill areas between the fins 52 (e.g., between the fins 52B and 52C). In some embodiments, the dielectric layer 60 may be deposited using a flowable deposition process, a spin-on process, or the like. The dielectric layer 60 may comprise a carbon-containing dielectric film (e.g., a carbon-containing nitride, such as, SiCN or a carbon-containing oxide, such as, SiOC), a metal-containing dielectric film (e.g., a metal-containing oxide, such as, a combination of SiO and a metal), or the like. In an embodiment, the dielectric layer 58 and the dielectric layer 60 comprise SiCN and the dielectric layer 58 and the dielectric layer 60 have a carbon concentration in a range from about 6 percent to about 12 percent by weight of carbon. In an embodiment, the carbon concentration of the dielectric layer 60 is higher than the carbon concentration of the dielectric layer 58.

Figure 7A:
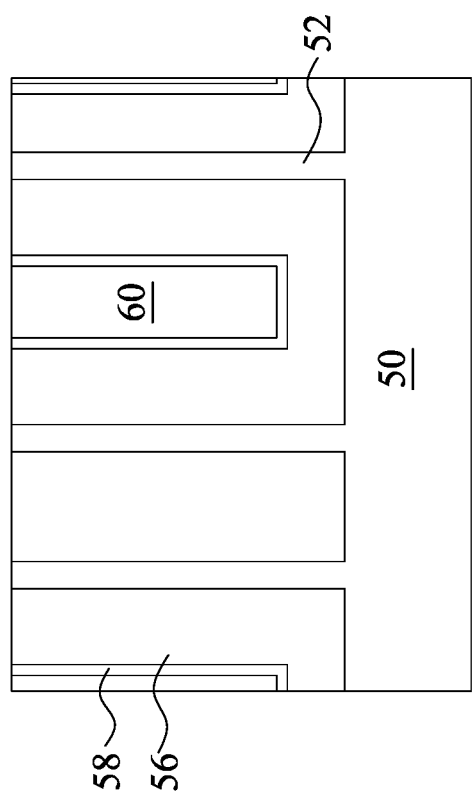
Figure 7B:
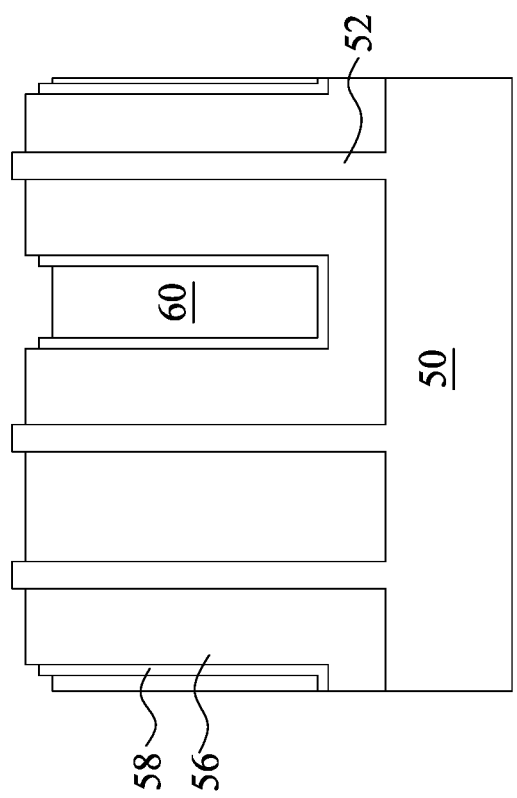

In FIG. 7A, a planarization (e.g., a chemical mechanical polish (CMP)) and/or etch back process (e.g., a dry etching process) is used to expose upper surfaces of the fins 52. In particular, upper portions of the dielectric layer 60, the dielectric layer 58, the dielectric layer 56, and the mask layer 54 are removed so that fins 52 are exposed. In some embodiments, exposing the fins 52 results in upper surfaces of the dielectric layer 60, the dielectric layer 58, the dielectric layer 56, and the fins 52 being substantially coplanar. In other embodiments, exposing the fins 52 results in upper surfaces of the dielectric layer 60, the dielectric layer 58, the dielectric layer 56, and the fins 52 being non-coplanar (see e.g., FIG. 7B). Variances in height may be due to the different material compositions of the fins 52, the dielectric layer 56, the dielectric layer 58, and the dielectric layer 60 being polished/etched at different rates during an applicable planarization process. Although subsequent figures illustrate these upper surfaces as being coplanar for ease of illustration, it is understood that embodiments with non-coplanar upper surfaces, such as illustrated by FIG. 7B, are also contemplated in subsequent processing steps and/or subsequently described embodiments.

Figure 8:
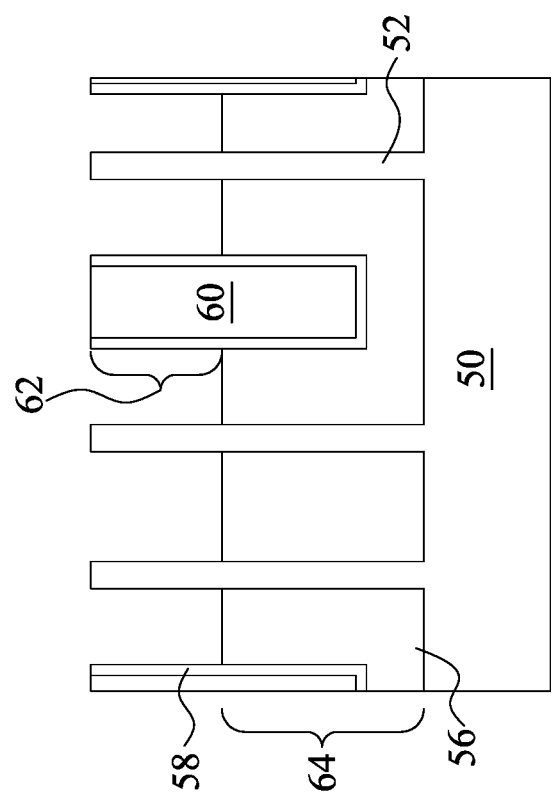

In FIG. 8, an additional etch back process is performed on the dielectric layer 56. The dielectric layer 56 is recessed such that portions of semiconductor fins 52 and dummy fins 62 protrude above top surfaces of the dielectric layer 56. In some embodiments, after recessing, a height of the semiconductor fins 52 may be substantially the same as a height of the dummy fins 62. Dummy fins 62 are made of upper portions of the dielectric layer 58 and upper portions of the dielectric layer 60, which extend above a top surface of the dielectric layer 56. Thus, the dummy fins 62 may have a different material composition than semiconductor fins 52, and the dummy fins 62 may be insulating fins. Further, remaining portions of the dielectric layer 56, lower portions of the dielectric layer 58, and lower portions of the dielectric layer 60 (referred to collectively as isolation region 64) provide electrical isolation between adjacent fins 52 and may further provide shallow trench isolation (STI) regions between the fins 52 such that a separate STI region need not be formed.

Further, in FIG. 8, patterning dielectric layer 56 may use a selective etching process which selectively etches the dielectric layer 56 at a faster rate than the dielectric layer 58, the dielectric layer 60, and the fins 52. For example, the etching process may use fluorine and nitrogen containing chemistries, or the like, and the etching may be performed at a temperature of about 30° C. to about 120° C. Such selective etching may be enabled, for example, by the inclusion of carbon and/or a metal in the dielectric layer 58 and the dielectric layer 60.

Further in FIG. 8, appropriate wells (not shown) may be formed in the fins the fins 52 and/or the substrate 50. In some embodiments, a P well may be formed in the region 50C, and an N well may be formed in the region 50D. In some embodiments, an N well may be formed in the region 50C, and a P well may be formed in the region 50D. In some embodiments, a P well or an N well are formed in both the region 50C and the region 50D.

In the embodiments with different well types, the different implant steps for the region 50C and the region 50D (see FIG. 2) may be achieved using a photoresist or other masks (not shown). For example, a photoresist may be formed over the fins 52 and the dummy fins 62 in the region 50C. The photoresist is patterned to expose the region 50D of the substrate 50, such as a PMOS region. The photoresist can be formed by using a spin-on technique and can be patterned using acceptable photolithography techniques. Once the photoresist is patterned, an n-type impurity implant is performed in the region 50D, and the photoresist may act as a mask to substantially prevent n-type impurities from being implanted into the region 50C, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50D, a photoresist is formed over the fins 52 and the dummy fins 62 in the region 50D. The photoresist is patterned to expose the region 50C of the substrate 50, such as the NMOS region. The photoresist can be formed by using a spin-on technique and can be patterned using acceptable photolithography techniques. Once the photoresist is patterned, a p-type impurity implant may be performed in the region 50C, and the photoresist may act as a mask to substantially prevent p-type impurities from being implanted into the region 50D, such as the PMOS region. The p-type impurities may be boron, $BF_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50C and the region 50D, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 9A:
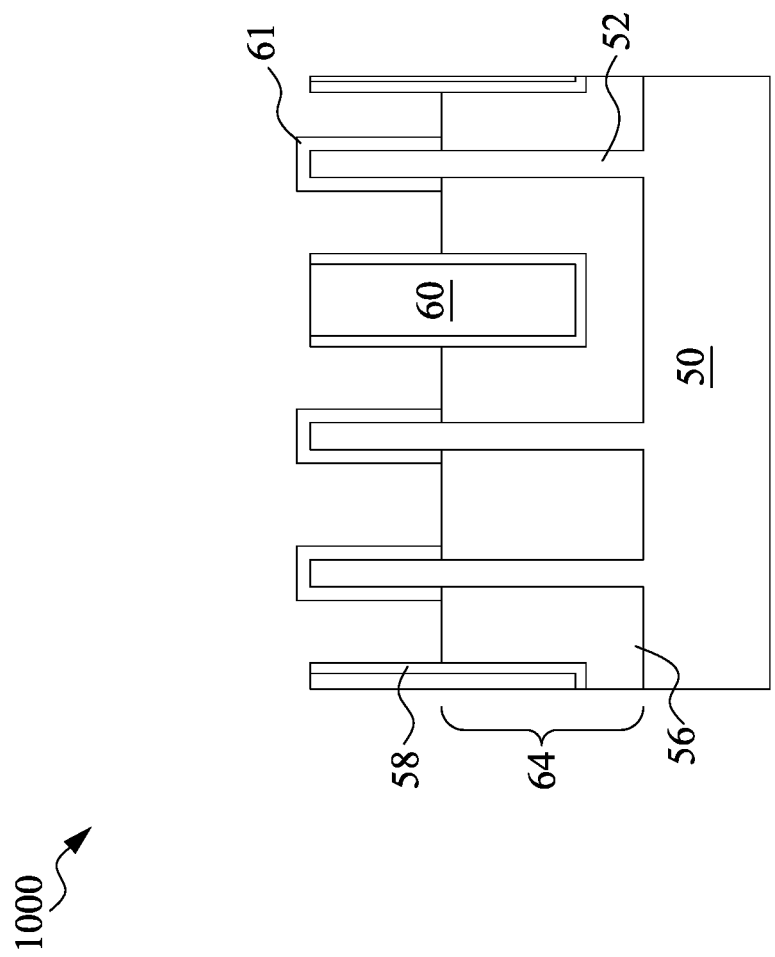
FIG. 9A is a cross-sectional view of an intermediate stage in the manufacturing of FinFETs, in accordance with some embodiments.
Figure 9B:
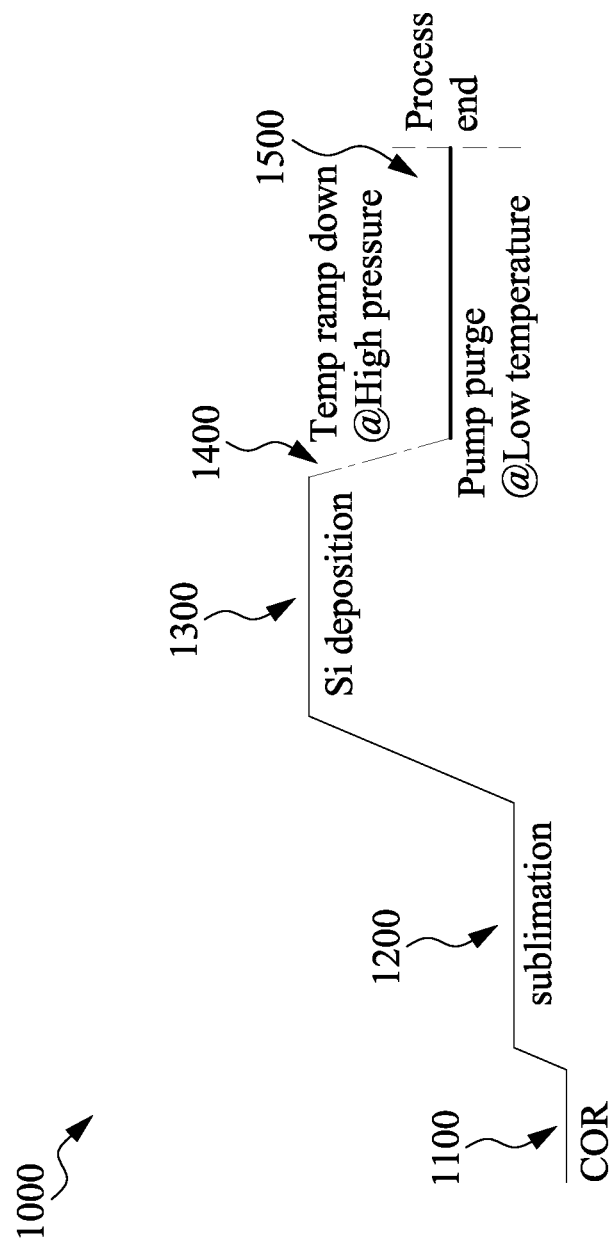
FIG. 9B shows a temperature vs time trace for a FinFET referenced in FIG. 9A.

In FIGS. 9A and 9B, a process 1000 for the forming of a cap layer 61 on exposed portions of the fins 52 is illustrated. In an embodiment, the cap layer 61 may be formed of silicon (e.g., poly-crystalline silicon), silicon germanium, or the like. The cap layer 61 may be formed by CVD, furnace CVD, ALD, epitaxial growth, or the like. In a specific embodiment, the cap layer 61 may be formed by loading the substrate 50 illustrated in FIG. 8 into a furnace, performing a pre-clean process on the fins 52, performing a sublimation process, depositing the cap layer 61 on the fins 52, and cooling the substrate 50.

As an initial step in forming the cap layer 61, a pre-clean process 1100 (shown in FIG. 9B) is performed on the exposed portions of the fins 52 to remove a native oxide layer resulting from oxidation of the exposed surfaces of the fins 52. In some embodiments, the pre-clean process 1100 may be performed using an HF-based gas, a SiCoNi-based gas, or the like. In other embodiments, the pre-clean process 1100 may be performed using a wet etch with an etchant such as a solution including hydrofluoric acid (HF); although other etchants, such as $H_2$, and other methods, such as a reactive ion etch, a dry etch with etchants such as $NH_3/NF_3$, chemical oxide removal (COR), or dry chemical clean may be used. In still further embodiments, the pre-clean process 1100 may use an $NH_3$ remote plasma pre-clean process. The pre-clean process 1100 may be performed in situ after the substrate 50 is loaded into the furnace. In other embodiments, the pre-clean process 1100 may be performed ex situ before the substrate 50 is loaded into the furnace. The pre-clean process 1100 may be performed at a temperature of between about 50° C. and about 350° C. The pre-clean process 1100 may improve the adhesion of the cap layer 61 to the fins 52.

A sublimation process 1200 (shown in FIG. 9B) is then performed in the furnace in order to prepare a precursor gas for depositing the cap layer 61. Precursors that may be used for the deposition of the cap layer 126 include $Si_xH_{2x+2}$ (e.g., silane ($SiH_4$), disilane ($Si_2H_6$) or the like), dichlorosilane ($SiH_2Cl_2$, also referred to as DCS), $GeH_4$, combinations thereof, or the like. In some embodiments, silicon may be sublimated in the presence of a carrier gas, such as hydrogen ($H_2$), nitrogen ($N_2$), or Helium (He). The sublimation process 1200 may be performed at a temperature of between about 50° C. and about 300° C. During the sublimation process 1200, the partial pressure of hydrogen gas in the furnace may be between about 1 mTorr and about 4 mTorr. The sublimation process 1200 may be used to stabilize the temperature, pressure, and precursor gas flow rate in the furnace prior to depositing the cap layer 61 on the fins 52.

The cap layer 61 is then deposited on the fins 52 in a cap layer deposition process 1300 (shown in FIGS. 9B and 9C) by raising the temperature of the furnace. In an embodiment, increasing the temperature of the furnace causes decomposition of the precursor gas and silicon from the precursor gas is deposited on exposed portions of the fins 52. The formation of the cap layer 61 is selective, so that it is grown on semiconductor materials such the fins 52 and not on the dielectric layer 56 and the dummy fins 62. This may be achieved, for example, by adding an etching gas into the precursor gas (e.g., silane, dichlorosilane, disilane, combinations thereof, or the like). The temperature of the furnace may be raised to a temperature that is above 400° C. The furnace may have a pressure of between about 0.1 Torr and about 10 Torr. Hydrogen gas may be flowed over the substrate 50 during the cap layer deposition process. The precursor gas (e.g., silane, dichlorosilane, disilane, combinations thereof, or the like) may be flowed over the substrate 50 during the cap layer deposition process 1300 at a flowrate of between about 10 sccm and about 500 sccm. In some embodiments, hydrogen, helium, nitrogen, or the like may be used as a carrier gas. The combination of the cap layer 61 and the fins 52 may function as a p-type channel or an n-type channel in subsequently formed transistors.

A temperature ramp down process 1400 (shown in FIGS. 9B and 9C) is then performed to lower the temperature of the furnace. In an embodiment, the temperature of the furnace may be lowered to room temperature. During a first portion 1401 of the temperature ramp down process 1400 a pressure of the furnace is gradually increased to be at about 10 torr or higher. During a second portion 1402 of the temperature ramp down process 1400 after the first portion 1401, a pressure of the furnace is maintained to be constant at about 10 torr or higher. During a third portion 1403 of the temperature ramp down process 1400 after the second portion 1402, a pressure of the furnace is gradually lowered with the help of a pump till it reaches a base pressure. The base pressure of the furnace may be about 0 torr. The temperature ramp down process 1400 may have a ramp down rate in a range from about 1° C./min to about 20° C./min. During the second portion 1402 of the temperature ramp down process 1400 the temperature of the furnace drops below 400° C. Accordingly, the pressure in the furnace is maintained at a relatively high level (e.g., at about 10 torr or higher), and the pressure is ramped down in the third portion 1403 only after the temperature in the furnace drops below 400° C. The temperature ramp down process 1400 may be conducted in an ambient atmosphere that comprises hydrogen or hydrogen radicals/plasma.

Next, a pump purge process 1500 is performed (shown in FIGS. 9B and 9C) where the pressure of the furnace is maintained at the base pressure with the main pump valve of the pump fully open. The temperature of the furnace is maintained to be at a temperature that is below 400° C., and an ambient atmosphere in the furnace may comprise hydrogen gas, nitrogen gas, or have no gas.

The cap layer 61 deposited on the fins 52 may comprise crystalline silicon. Advantages can be achieved as a result of the temperature ramp down process 1400 where a temperature of the furnace is lowered from above 400° C. to room temperature, where a pressure of the ramp down process is ramped up and maintained at a relatively high level (e.g., 10 torr or more) until after the temperature falls below 400° C. These advantages may include a reduction in the number of defects formed. For example, the number of silicon islands or ball type defects formed on dielectric films, dummy fins, and shallow trench isolation (STI) regions surrounding the semiconductor fin that are formed due to silicon migration can be reduced, and a more uniform silicon growth can be achieved. In addition, the diameter of ball type defects formed can be reduced to be below 8 nm. Accordingly, fin morphology is improved, and the risk of performance degradation is lowered.

Figure 9C:
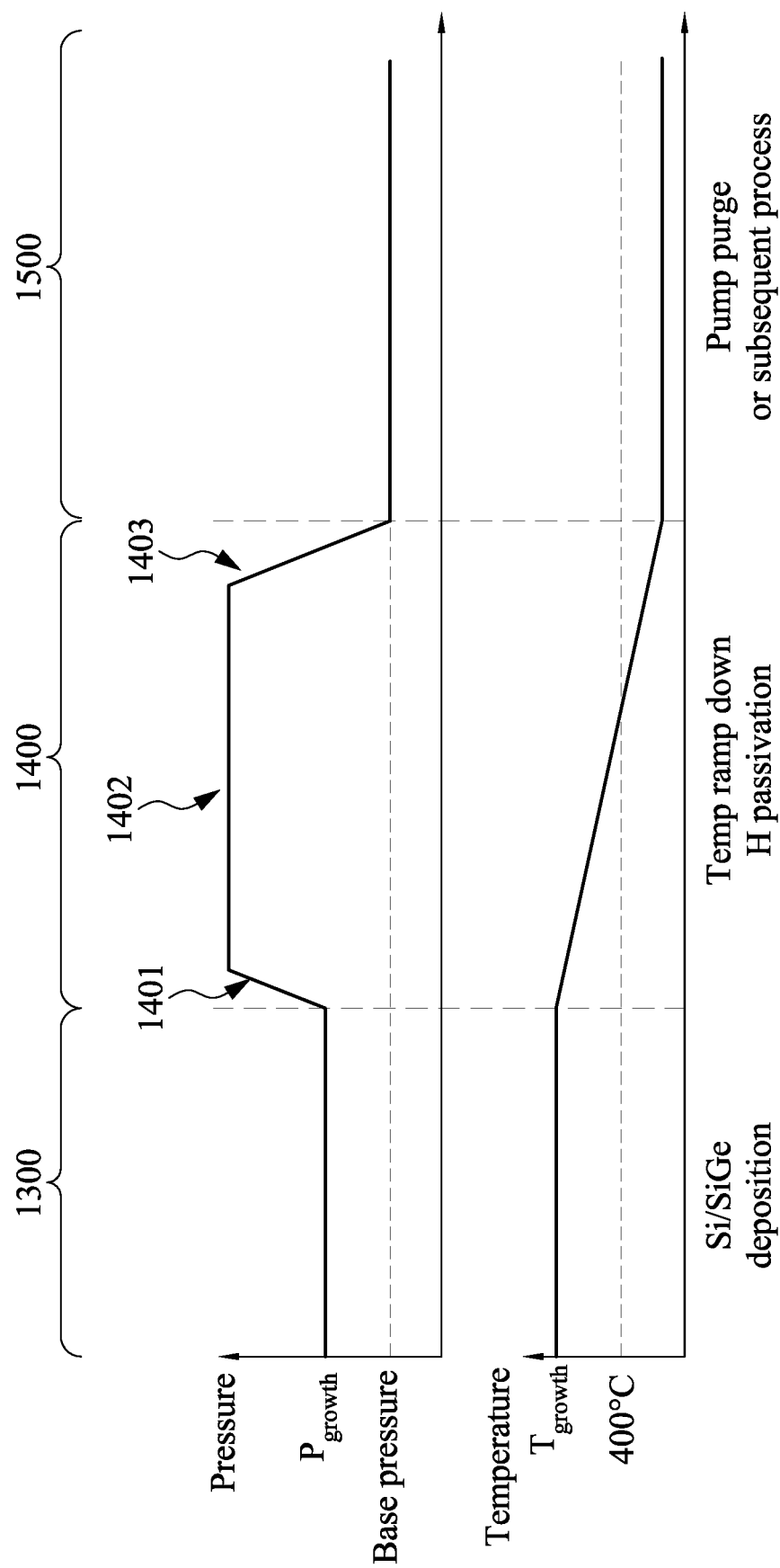
FIG. 9C shows pressure vs time and temperature vs time traces for a FinFET referenced in FIG. 9A.
Figure 9D:
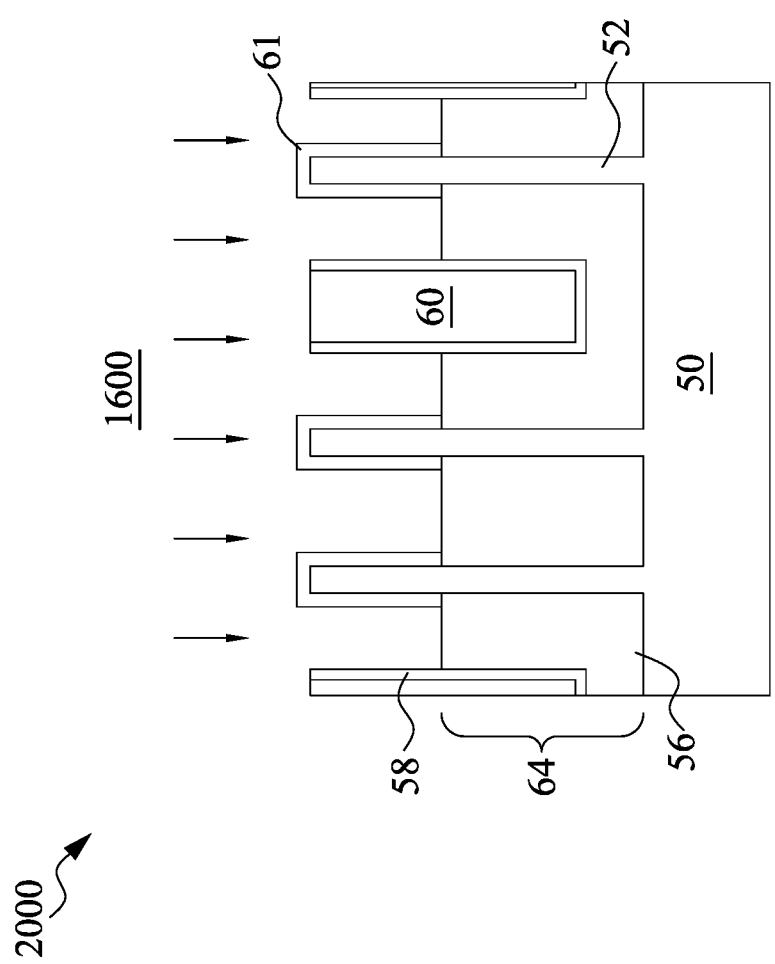
FIG. 9D is a cross-sectional view of an intermediate stage in the manufacturing of FinFETs, in accordance with some embodiments.
Figure 9E:
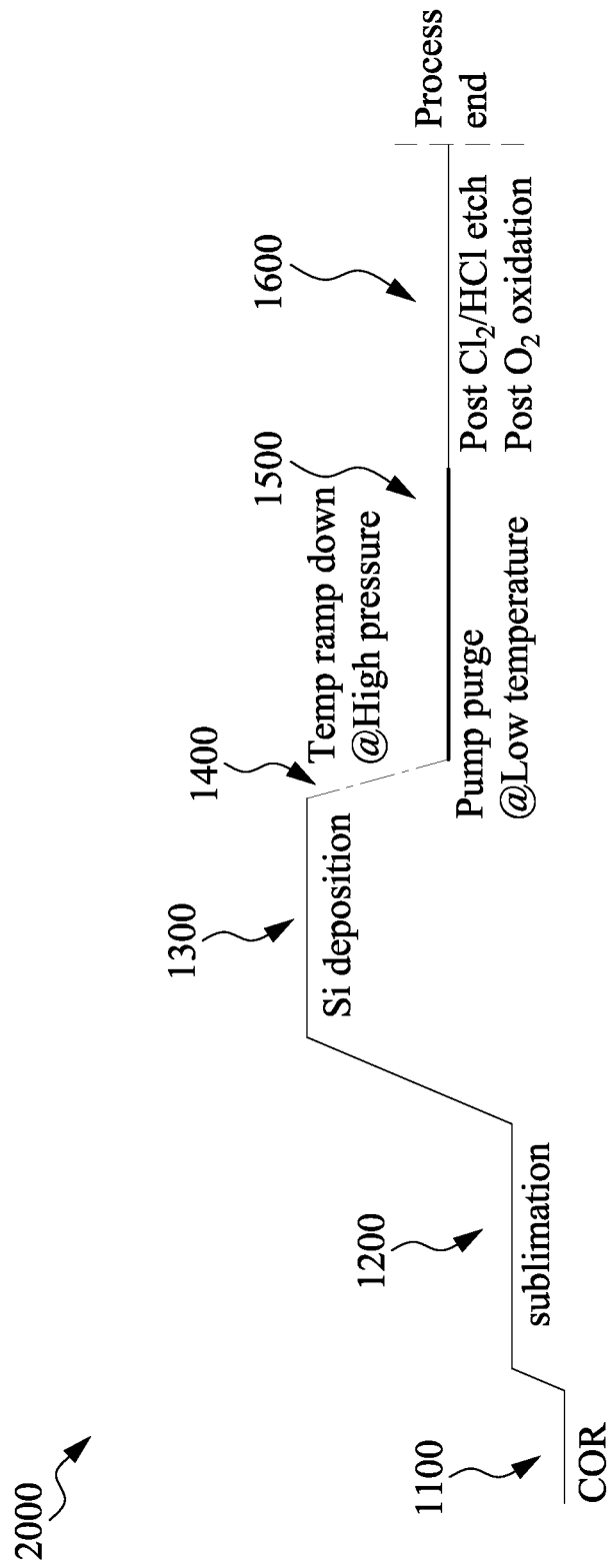
FIG. 9E shows a temperature vs time trace for a FinFET referenced in FIG. 9D.

FIGS. 9D and 9E illustrate process 2000, which is an alternative embodiment for the forming of the cap layer 61 on exposed portions of the fins 52. Unless specified otherwise, like reference numerals in this embodiment (and subsequently discussed embodiments) represent like processes of the process 1000 in the embodiment shown in FIGS. 9A through 9C. Accordingly, the process steps and applicable materials may not be repeated herein. The initial steps of this embodiment are essentially the same as shown in FIGS. 9A through 9C.

In the process 2000, after the pump purge process 1500 is performed (shown in FIGS. 9B and 9C), an optional etch process 1600 may be performed to selectively remove undesirable amorphous silicon islands or ball type defects on the dummy fins 62 without substantially etching or removing the crystalline silicon cap layer 61 on the fins 52. The etch process 1600 may comprise an HCl etch or $Cl_2$ etch, sometimes referred to as an HCl bake, a chlorine gas etch, or the like. In some embodiments, the etch process 1600 may be performed at a temperature between about 200° C. and about 400° C., and at a pressure between about 0.1 torr and about 5 torr. In some embodiments, the etch process 1600 may include a wet etch process with HCl that is performed by applying HCl to the cap layer 61 and the amorphous silicon islands or ball type defects on the dummy fins 62 for duration of between about 10 seconds to about 100 seconds. Because the etch rate of HCl on amorphous silicon is higher than the etch rate of HCl on crystalline silicon, the amorphous silicon islands or ball type defects on the dummy fins 62 may be selectively etched away while the cap layer 61 that is made up of crystalline silicon will be minimally effected.

Further processing may include formation of an oxide layer (not shown) on the cap layer 61, in some embodiments. The oxide layer may be formed by exposing the cap layer to oxygen gas. During the formation of the oxide layer, a temperature of the furnace may be between about 300° C. and about 500° C., and a pressure of the furnace may be between about 0.1 torr and about 5 torr. Portions of the dummy fins 62 may also be oxidized when the oxide layer is formed.

Figure 9F:
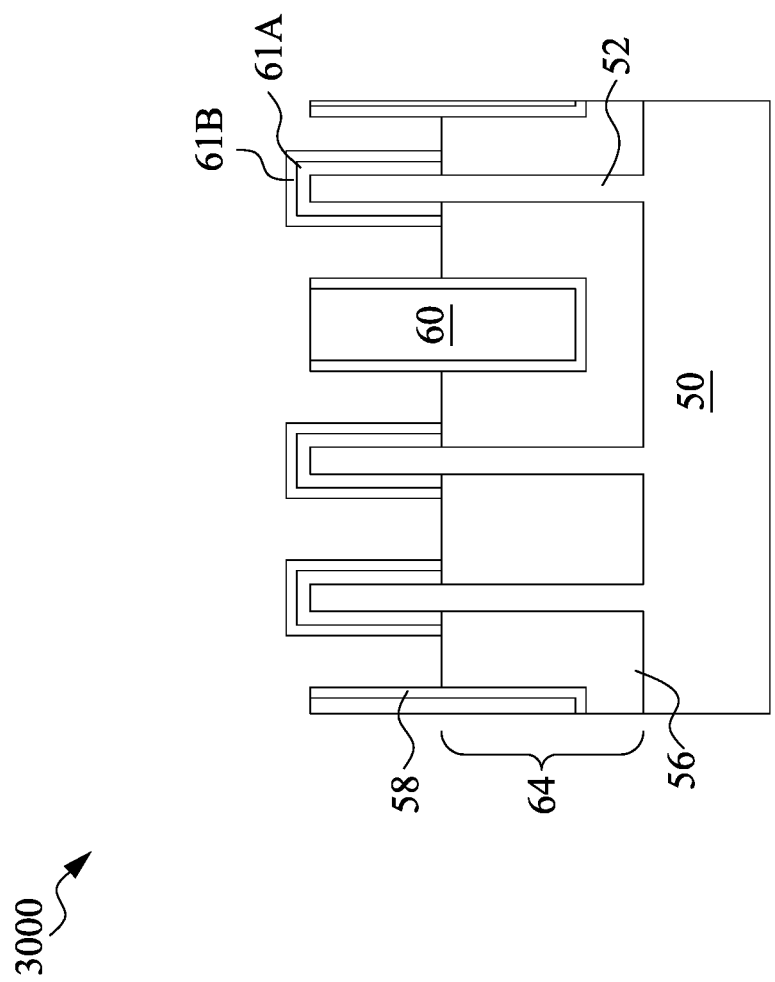
FIG. 9F is a cross-sectional view of an intermediate stage in the manufacturing of FinFETs, in accordance with some embodiments.
Figure 9G:
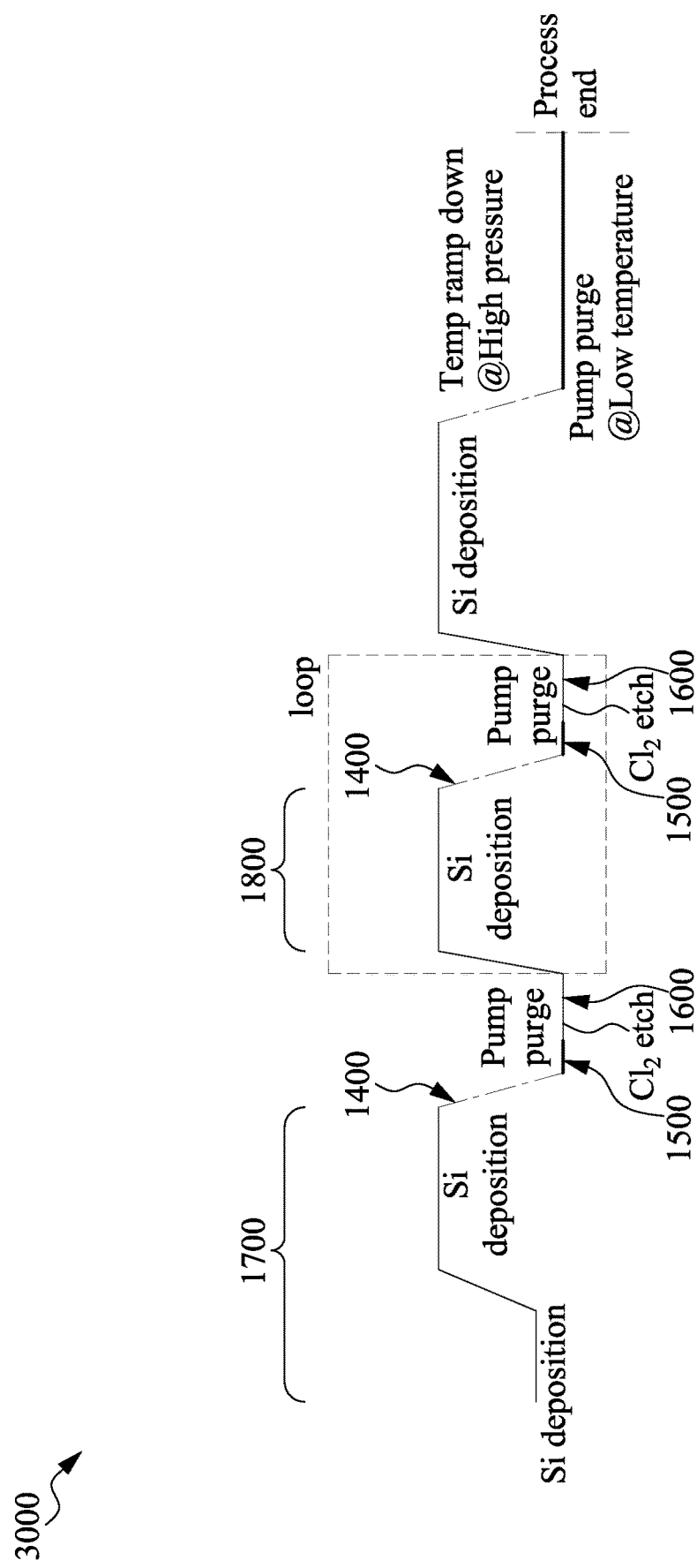
FIG. 9G shows a temperature vs time trace for a FinFET referenced in FIG. 9F.

FIGS. 9F and 9G illustrate process 3000, which is an alternative embodiment for the forming of the cap layer 61 on exposed portions of the fins 52. The process 3000 comprises the pre-clean process 1100 (described previously in FIG. 9B) followed by the sublimation process 1200 (described previously in FIG. 9B).

After the sublimation process 1200, the cap layer 61A may then be deposited on the fins 52 in a cap layer deposition process 1700 (shown in FIGS. 9F and 9G). The formation of the cap layer 61A is selective, so that it is grown on semiconductor materials such the fins 52 and not on the dielectric layer 56 and the dummy fins 62. The cap layer deposition process 1700 may comprise a first deposition being performed at a first temperature, and then a second deposition at a second temperature higher than the first temperature, where at least the second temperature is above 400° C. The furnace may have a pressure of between about 0.1 Torr and about 10 Torr. Hydrogen gas may be flowed over the substrate 50 during the cap layer deposition process 1700. The precursor gas (e.g., silane, dichlorosilane, disilane, combinations thereof, or the like) may be flowed over the substrate 50 during the cap layer deposition process 1700 at a flowrate of between about 10 sccm and about 500 sccm. In some embodiments, hydrogen, helium, nitrogen, or the like may be used as a carrier gas.

Next, a temperature ramp down process 1400 (described previously in FIGS. 9B and 9C), a pump purge process 1500 (described previously in FIGS. 9B and 9C) and an etch process 1600 (described previously in FIGS. 9D and 9E) may be performed sequentially in that order.

After the etch process 1600 is complete, the cap layer 61B may then be deposited over the cap layer 61A in a cap layer deposition process 1800 (shown in FIGS. 9F and 9G). The formation of the cap layer 61B is selective, so that it is grown on semiconductor materials such the fins 52 or the cap layer 6A and not on the dielectric layer 56 and the dummy fins 62. During the cap layer deposition process 1800, a temperature of the furnace may be above 400° C. The furnace may have a pressure of between about 0.1 Torr and about 10 Torr. Hydrogen gas may be flowed over the substrate 50 during the cap layer deposition process 1800. The precursor gas (e.g., silane, dichlorosilane, disilane, combinations thereof, or the like) may be flowed over the substrate 50 during the cap layer deposition process 1800 at a flowrate of between about 10 sccm and about 500 sccm. In some embodiments, hydrogen, helium, nitrogen, or the like may be used as a carrier gas.

Next, a temperature ramp down process 1400 (described previously in FIGS. 9B and 9C), a pump purge process 1500 (described previously in FIGS. 9B and 9C) and an etch process 1600 (described previously in FIGS. 9D and 9E) may be performed sequentially in that order.

The cap layer deposition process 1800, the temperature ramp down process 1400, the pump purge process 1500, and the etch process 1600 may be performed again in that order one or more times in order to obtain a thicker cap layer 61B. The process 3000 may be used to fill fin trenches in the fin with a-Si. The cyclic deposition/etch of the process 3000 can be used to form V-shaped a-Si and achieve a void-free gap fill in the trenches.

In some embodiments, the cap layer deposition process 1700 (shown in FIGS. 9F and 9G), the temperature ramp down process 1400 (described previously in FIGS. 9B and 9C), the pump purge process 1500 (described previously in FIGS. 9B and 9C), the etch process 1600 (described previously in FIGS. 9D and 9E), the cap layer deposition process 1800 (shown in FIGS. 9F and 9G), the temperature ramp down process 1400 (described previously in FIGS. 9B and 9C), the pump purge process 1500 (described previously in FIGS. 9B and 9C), and the etch process 1600 (described previously in FIGS. 9D and 9E) may be performed sequentially in that order to fill in trenches in shallow trench isolation (STI) regions (e.g., in a gap-fill process). After the last etch process 1600 is complete, the cap layer deposition process 1800, the temperature ramp down process 1400, the pump purge process 1500, and the etch process 1600 may be performed again in that order to deposit silicon of higher thickness. The cap layer deposition process 1800, the temperature ramp down process 1400, the pump purge process 1500, and the etch process 1600 may be performed a number of times in a cyclical fashion. The number of cycles is not limited to the number of cycles described above.

Figure 10B:
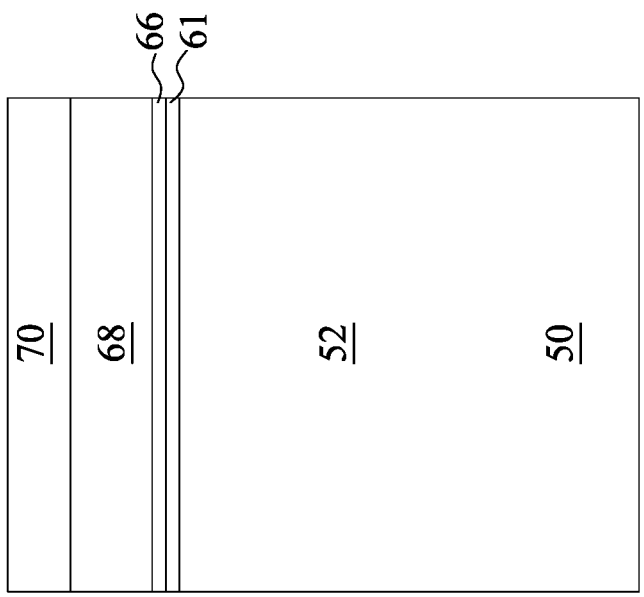
FIGS. 10A, 10B, 11A, 11B, 12A, 12B, 13A, 13B, 13C, 13D, 14A, 14B, 15A, 15B, 16A, 16B, 17A, 17B, 18A, and 18B are cross-sectional views of intermediate stages in the manufacturing of FinFETs, in accordance with some embodiments.
Figure 10A:
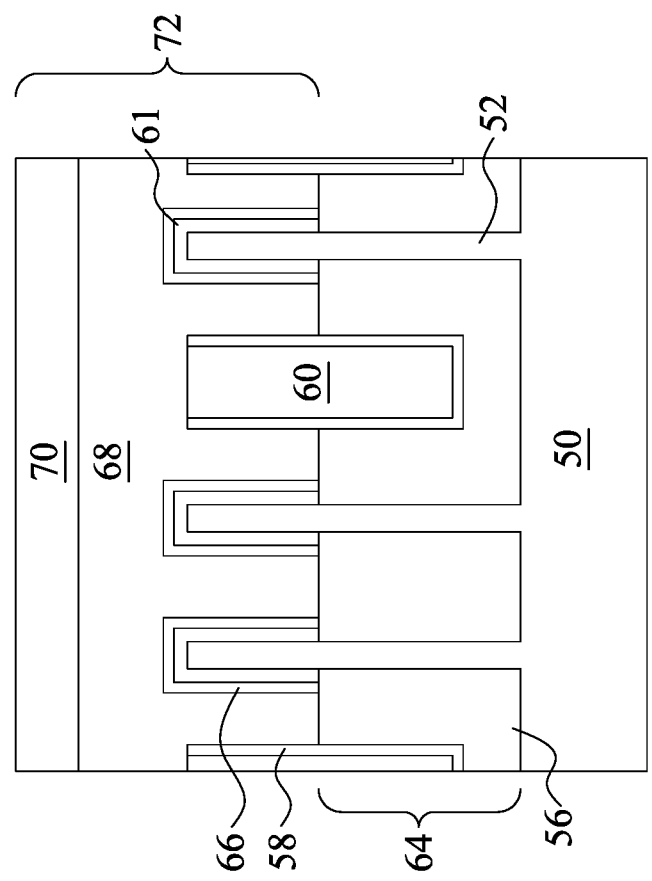

In FIGS. 10A, and 10B, a dummy dielectric layer 66 is formed on a portion of the cap layer 61 that is on the fins 52. FIG. 10A illustrates a cross-sectional view taken along line A-A of FIG. 1; FIG. 10B illustrates a cross-sectional view taken along line C-C of FIG. 1. The dummy dielectric layer 66 may be, for example, silicon oxide, silicon nitride, a combination thereof, or the like, and may be deposited or thermally grown according to acceptable techniques. For example, FIGS. 10A through 10B illustrate the dummy dielectric layer 66 formed using an embodiment thermal oxidation process where the dummy dielectric layer 66 is selectively grown on the cap layer 61 without being grown on the dummy fins 62. In other embodiments (e.g., where dummy dielectric layer 66 is deposited), the dummy dielectric layer 66 is formed on the cap layer 61 as well as the dummy fins 62 and the dielectric layer 56. A dummy gate layer 68 is formed over the dummy dielectric layer 66, and a mask layer 70 is formed over the dummy gate layer 68. The dummy gate layer 68 may be deposited over the dummy dielectric layer 68 and then planarized, such as by a CMP. The mask layer 70 may be deposited over the dummy gate layer 68. The dummy gate layer 68 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 68 may be deposited by physical vapor deposition (PVD), CVD, sputter deposition, or other techniques known and used in the art for depositing conductive materials. The dummy gate layer 68 may be made of other materials that have a high etching selectivity from the etching of isolation regions. The mask layer 70 may include, for example, SiN, SiON, or the like. In this example, a single dummy gate layer 68 and a single mask layer 70 are formed across the region 50C and the region 50D (see FIG. 2). In some embodiments, separate dummy gate layers may be formed in the region 50C and the region 50D, and separate mask layers may be formed in the region 50C and the region 50D.

FIGS. 11A through 18B illustrate various additional steps in the manufacturing of embodiment devices. FIGS. 11A through 18B illustrate features in either of the region 50C and the region 50D. For example, the structures illustrated in FIGS. 11A through 18B may be applicable to both the region 50C and the region 50D. Differences (if any) in the structures of the region 50C and the region 50D are described in the text accompanying each figure. FIGS. 11A, 12A, 13A, 14A, 15A, 16A, 17A and 18A are illustrated along reference cross-section A-A illustrated in FIG. 1, and FIGS. 11B, 12B, 13B, 14B, 15B, 16B, 17B and 18B are illustrated along a similar cross-section C-C illustrated in FIG. 1, except for multiple fins/FinFETs. FIGS. 13C and 13D are illustrated along reference cross-section B-B illustrated in FIG. 1, except for multiple fins/FinFETs.

Figure 11B:
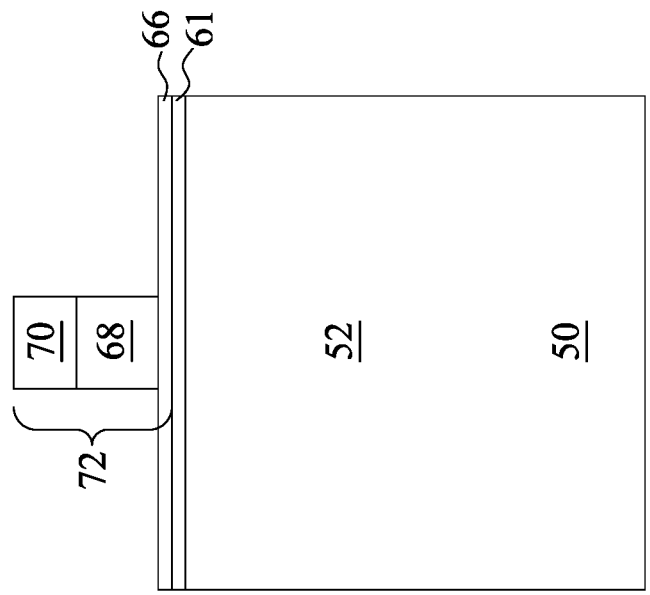
Figure 11A:
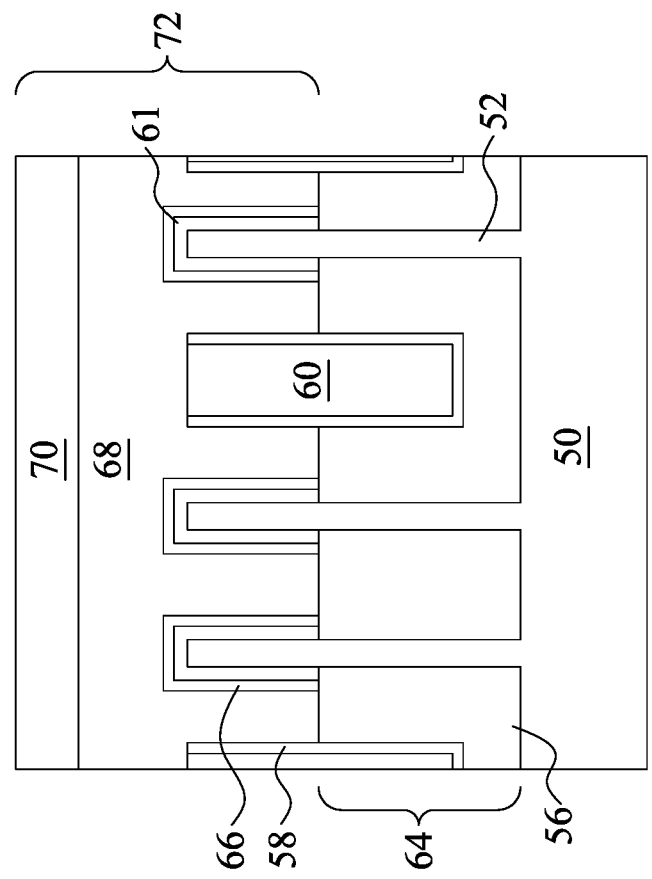

In FIGS. 11A, and 11B, the mask layer 70 may be patterned using acceptable photolithography and etching techniques to form masks 70. The pattern of the masks 70 then may be transferred to the dummy gate layer 68 and the dummy dielectric layer 66 by an acceptable etching technique to form dummy gates 72. The dummy gates 72 cover respective channel regions of the fins 52. The pattern of the masks 70 may be used to physically separate each of the dummy gates 72 from adjacent dummy gates. The dummy gates 72 may also have a lengthwise direction substantially perpendicular to the lengthwise direction of respective epitaxial fins 52 and the dummy fins 62. Further the dummy fins 62 may provide additional structural support for the dummy gates 72 formed over and along sidewalls of the dummy fins 62.

Further, gate seal spacers (not explicitly illustrated) can be formed on exposed surfaces of the dummy gates 72, the masks 70, and/or the cap layer 61. A thermal oxidation or a deposition followed by an anisotropic etch may form the gate seal spacers.

After the formation of the gate seal spacers, implants for lightly doped source/drain (LDD) regions (not explicitly illustrated) may be performed. In the embodiments with different device types, similar to the implants discussed above in FIG. 8, a mask, such as a photoresist, may be formed over the region 50C, while exposing the region 50D, and appropriate type (e.g., n-type or p-type) impurities may be implanted into the exposed fins 58 in the region 50D. The mask may then be removed. Subsequently, a mask, such as a photoresist, may be formed over the region 50D while exposing the region 50C, and appropriate type impurities may be implanted into the exposed fins 52 in the region 50C. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 12B:
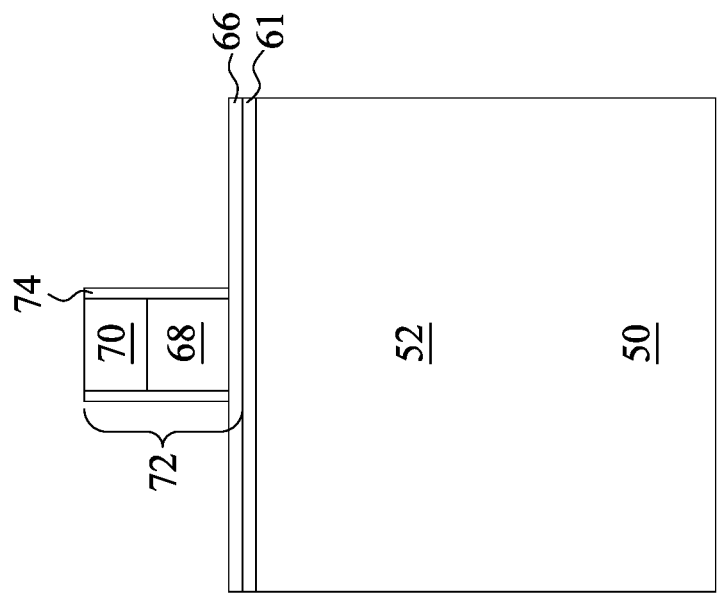
Figure 12A:
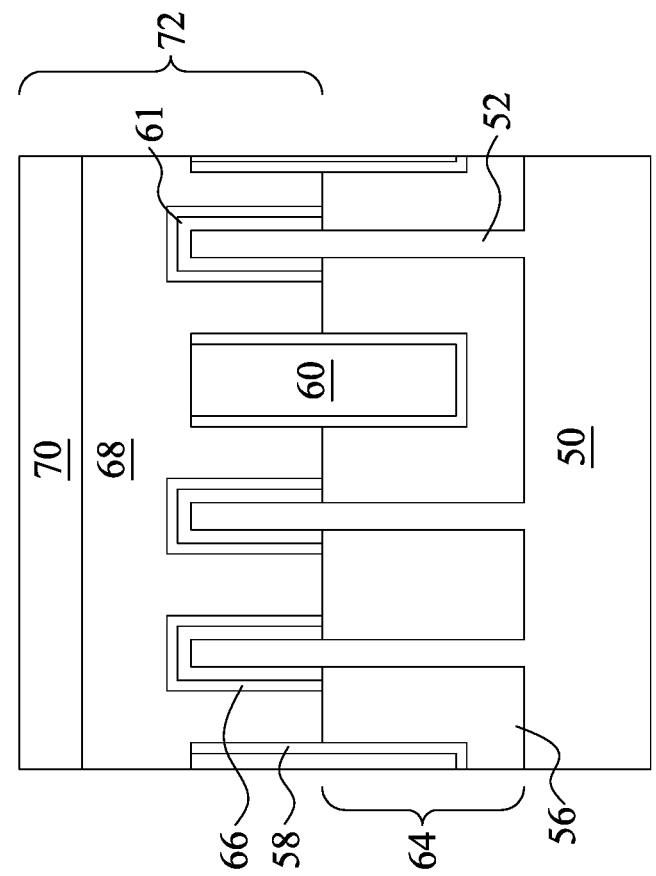

In FIGS. 12A, and 12B, gate spacers 74 are formed on the gate seal spacers (not explicitly illustrated) along sidewalls of the dummy gates 72. The gate spacers 74 may be formed by conformally depositing a material and subsequently anisotropically etching the material. The material of the gate spacers 74 may be silicon nitride, SiCN, a combination thereof, or the like.

Figure 13B:
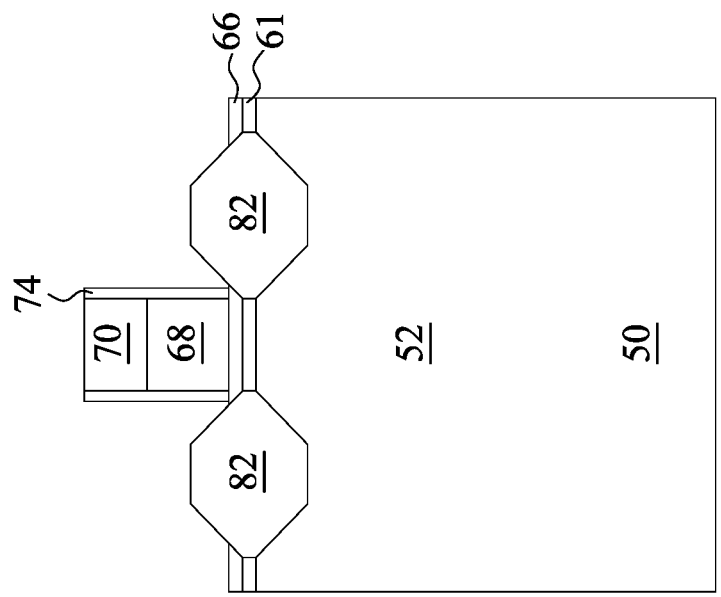
Figure 13A:
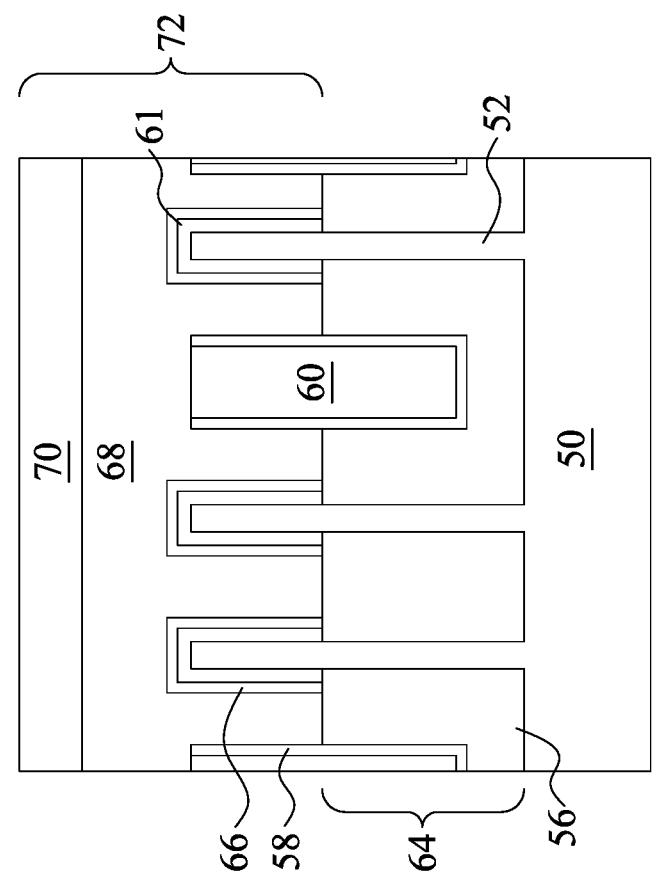
Figure 13C:
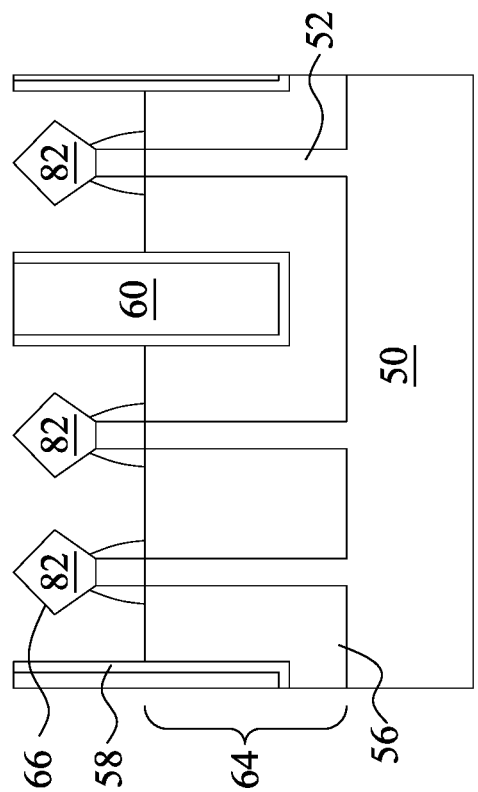
Figure 13D:
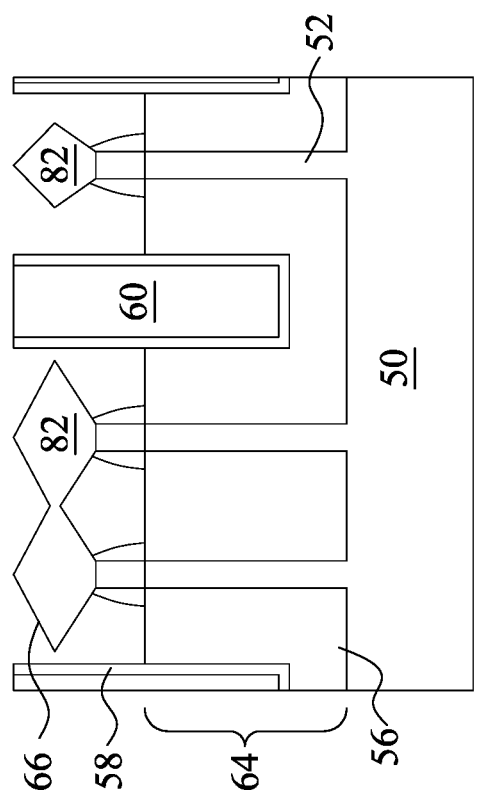

In FIGS. 13A and 13B, epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments that epitaxial source/drain regions 82 may extend into the fins 52. In some embodiments, the gate spacers 74 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions of the fins 52, thereby improving performance.

Referring to FIGS. 13A and 13B, portions of the dummy dielectric layer 66, the cap layer 61, and the fins 52 are etched, such as portions of the dummy dielectric layer 66, the cap layer 61, and the fins 52 that are not masked by the dummy gates 72. Recessing the fins 52 may use a selective etch process which etches the fins 52 without significantly etching the dummy gates 72 or the dummy fins 62. In various embodiments, the fins 52 may be recessed separately in the regions 50C and 50D, for example, while the other region is masked.

The epitaxial source/drain regions 82 in the region 50C, e.g., the NMOS region, may be formed by masking the region 50D, e.g., the PMOS region, and etching source/drain regions of the fins 52 in the region 50C to form recesses in the fins 52. Then, the epitaxial source/drain regions 82 in the region 50C are epitaxially grown in the recesses. The epitaxial source/drain regions 82 may include any acceptable material, such as appropriate for n-type FinFETs. For example, if the fin 52 is silicon, the epitaxial source/drain regions 82 in the region 50C may include silicon, SiC, SiCP, SiP, or the like. The epitaxial source/drain regions 82 in the region 50C may have surfaces raised from respective surfaces of the fins 52 and may have facets. In some embodiments, the dummy fins 62 provide physical separation between adjacent ones of the epitaxial source/drain regions 82 in the region 50C and prevent merging of adjacent epitaxial source/drain regions 82 in the region 50C during epitaxy.

The epitaxial source/drain regions 82 in the region 50D, e.g., the PMOS region, may be formed by masking the region 50C, e.g., the NMOS region, and etching source/drain regions of the fins 52 in the region 50D to form recesses in the fins 52. Then, the epitaxial source/drain regions 82 in the region 50D are epitaxially grown in the recesses. The epitaxial source/drain regions 82 may include any acceptable material, such as appropriate for p-type FinFETs. For example, if the fin 52 is silicon, the epitaxial source/drain regions 82 in the region 50D may comprise SiGe, SiGeB, Ge, GeSn, or the like. The epitaxial source/drain regions 82 in the region 50D may also have surfaces raised from respective surfaces of the fins 52 and may have facets. In some embodiments, the dummy fins 62 provide physical separation between adjacent ones of the epitaxial source/drain regions 82 in the region 50D and prevents merging of adjacent epitaxial source/drain regions 82 in the region 50D during epitaxy.

The epitaxial source/drain regions 82 and/or the fins 52 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50C and the region 50D, upper surfaces of the epitaxial source/drain regions 82 have facets which expand laterally outward beyond a sidewalls of the fins 52. The upper surfaces of the epitaxial source/drain regions 82 may contact sidewalls of the dummy fins 62, and the dummy fins 62 may prevent adjacent epitaxial source/drain regions 82 from merging. In some embodiments, the facets cause adjacent source/drain regions 82 to merge as illustrated by FIG. 13C. In other embodiments, adjacent source/drain regions 82 remain separated after the epitaxy process is completed as illustrated by FIG. 13D. The epitaxial source/drain regions 82 formed in the fins 52 may be merged, as illustrated in FIG. 13C, or separated, as illustrated in FIG. 13D.

Figure 14B:
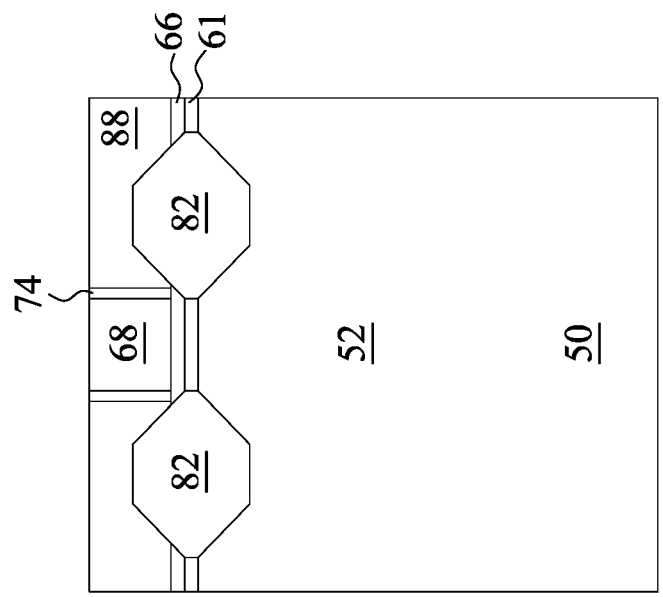
Figure 14A:
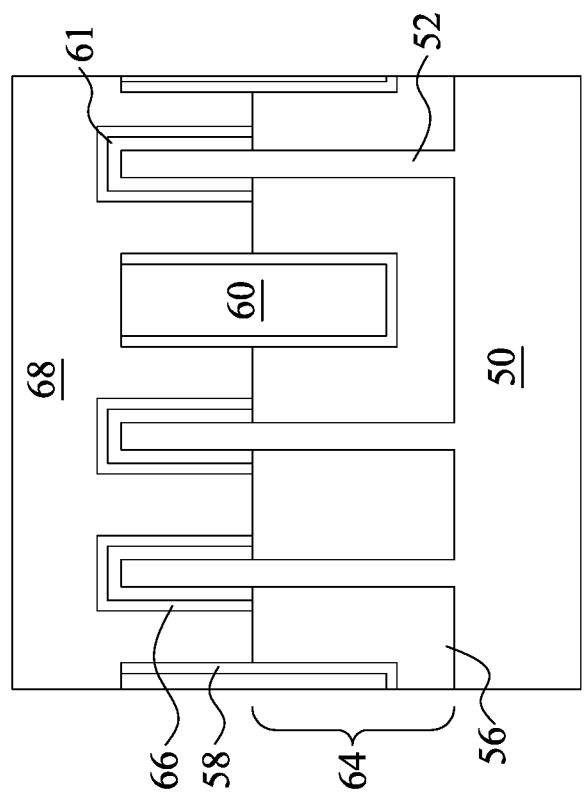

In FIGS. 14A and 14B, an ILD 88 is deposited over the structure illustrated in FIGS. 13A and 13B. The ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL), not illustrated, is disposed between the ILD 88 and the epitaxial source/drain regions 82, the hard mask 70, and the gate spacers 74.

Subsequently, a planarization process, such as a CMP, may be performed to level the top surface of the ILD 88 with the top surfaces of the dummy gate electrodes 68. The planarization process may also remove the masks 70 on the dummy gate electrodes 68, and portions of the gate seal spacers and the gate spacers 74 along sidewalls of the masks 70. After the planarization process, top surfaces of the dummy gate electrodes 68, the gate spacers 74, and the ILD 88 are level. Accordingly, the top surfaces of the dummy gate electrodes 68 are exposed through the ILD 88.

Figure 15B:
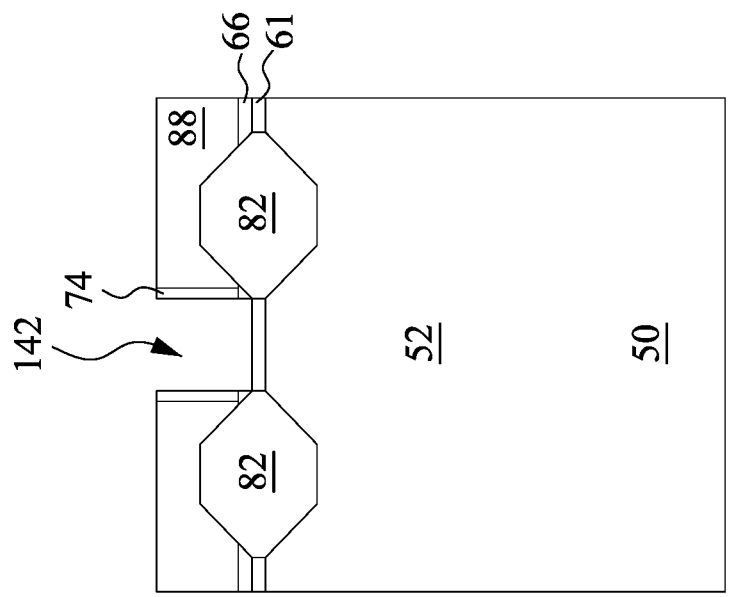
Figure 15A:
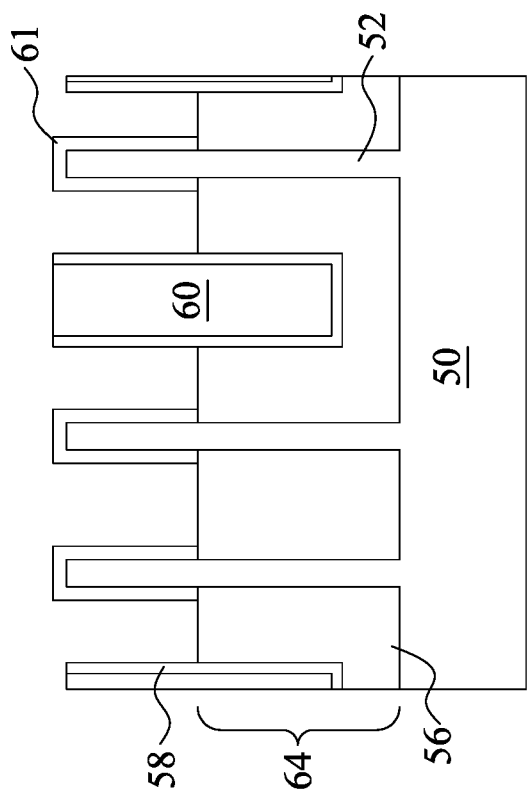

In FIGS. 15A and 15B, the dummy gate electrodes 68 and portions of the dummy dielectric layer 66 directly underlying the exposed dummy gate electrodes 68 are removed in an etching step(s), so that recesses are formed. In some embodiments, the dummy gate electrodes 68 are removed by an anisotropic dry etch process. For example, the etching process may include a dry etch process using reaction gas(es) that selectively etch dummy gate electrodes 68 without etching the ILD 88 or the gate spacers 74. Each recess exposes a channel region of a respective fin 52. Each channel region is disposed between neighboring pairs of the epitaxial source/drain regions 82. During the removal, the dummy dielectric layer 66 may be used as an etch stop layer when the dummy gate electrodes 68 are etched. The dummy dielectric layer 66 may then be removed after the removal of the dummy gate electrodes 68.

Figure 16B:
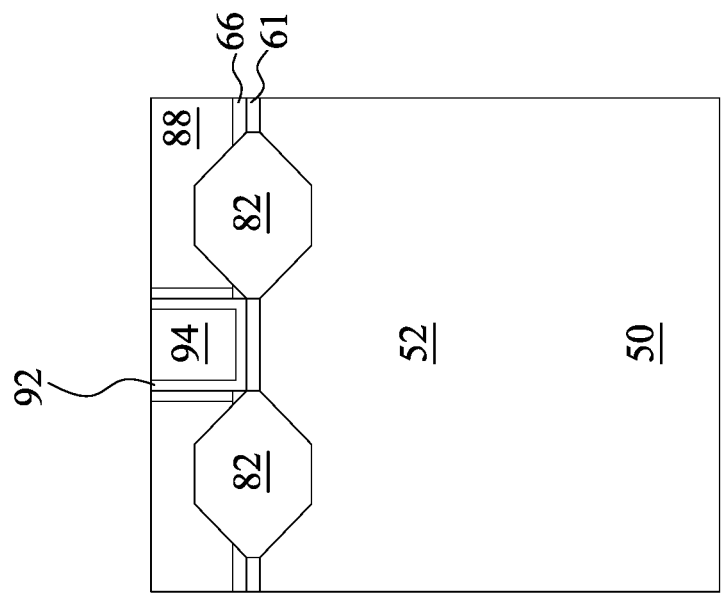
Figure 16A:
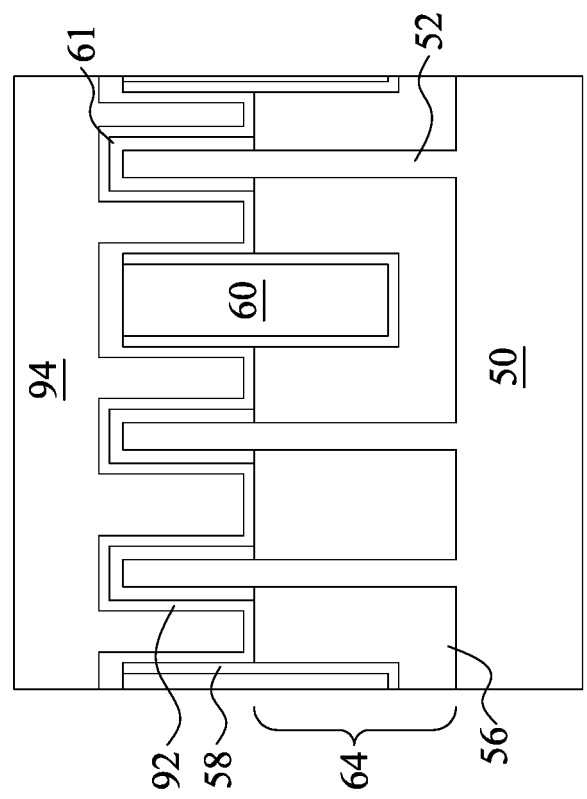

In FIGS. 16A and 16B, gate dielectric layers 92 and gate electrodes 94 are formed for replacement gates. Gate dielectric layers 92 are deposited conformally in the recesses, such as on the top surfaces and the sidewalls of the cap layer 61 that is on the fins 52, the top surfaces and the sidewalls of the dummy fins 62, top surfaces of the dielectric layer 56, and on sidewalls of the gate seal spacers 74. The gate dielectric layers 92 may also be formed on top surface of the ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like.

The gate electrodes 94 are deposited over the gate dielectric layers 92, respectively. The gate electrodes 94 may be a metal-containing material such as TiN, TaN, TaC, Co, Ru, Al, combinations thereof, or multi-layers thereof. For example, although a single gate electrode 94 is illustrated, any number of work function tuning layers may be deposited in the recesses 90. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate" or a "gate stack." The gate and the gate stacks may extend along sidewalls of a channel region of the fins 52 and along sidewalls of the dummy fins 62.

The formation of the gate dielectric layers 92 in the region 50C and the region 50D may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Figure 17B:
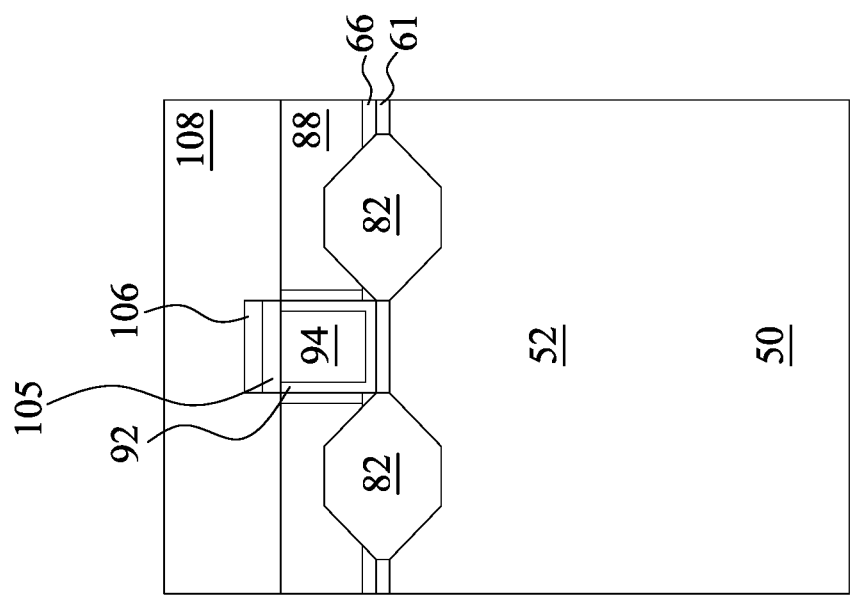
Figure 17A:
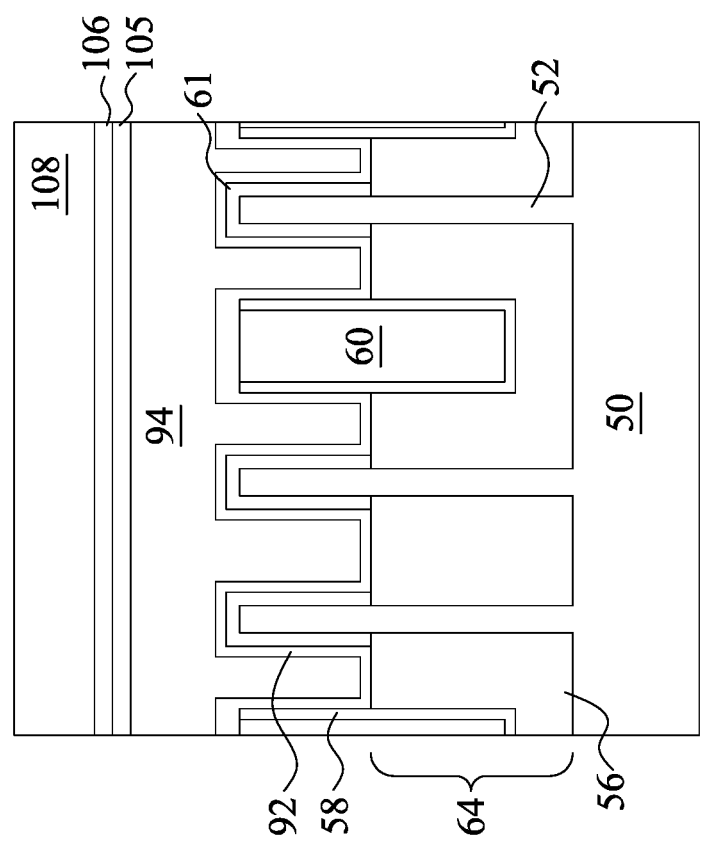

In FIGS. 17A and 17B, a silicide layer 105 and a conductive layer 106 may be formed over the gate electrodes 94 using a deposition process such as chemical vapor deposition, or the like. The silicide layer 105 and the conductive layer 106 may be patterned using acceptable photolithography techniques. The silicide layer 105 may comprise titanium, nickel, cobalt, or erbium, or the like and may be used to reduce the Schottky barrier height of a subsequently formed gate contact 110 (described in FIGS. 18A and 18B). The conductive layer 106 may comprise a metal such as copper, tungsten, cobalt, or the like. Next, an ILD 108 is deposited over the silicide layer 105, the conductive layer 105, and the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD.

Figure 18B:
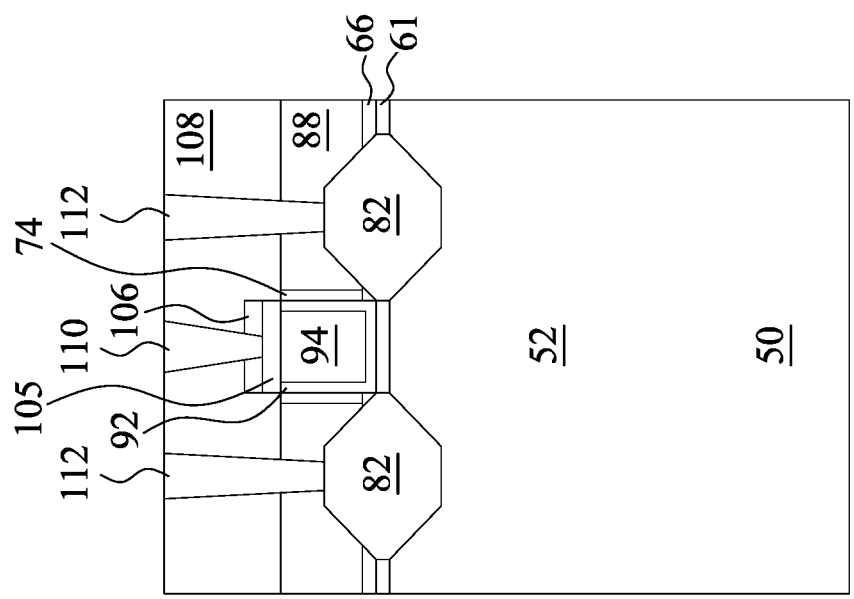
Figure 18A:
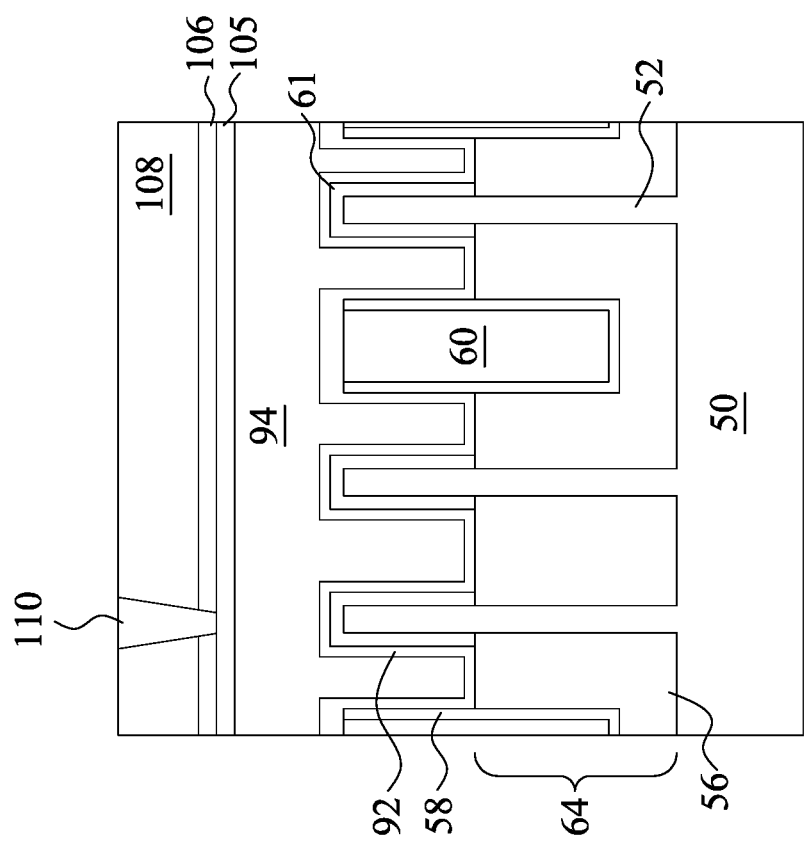

In FIGS. 18A and 18B, gate contact 110 and source/drain contacts 112 are formed through the ILD 108 and the ILD 88. Openings for the source/drain contacts 112 (not separately illustrated) are formed through the ILD 108 and the ILD 88, and openings for the gate contact 110 (not separately illustrated) are formed through the second ILD 108 and the conductive layer 106. The openings may be formed using acceptable photolithography and etching techniques. In some embodiments, an anneal process may be performed to form a silicide at the interface between the epitaxial source/drain regions 82 and the source/drain contacts 112 prior to the source/drain contacts 112 being formed.

The gate contact 110 and the source/drain contacts 112 may be formed of conductive materials such as Al, Cu, W, Co, Ti, Ta, Ru, TiN, TiAl, TiAlN, TaN, TaC, NiSi, CoSi, combinations of these, or the like, although any suitable material may be used. The material of the gate contact 110 and the source/drain contacts 112 may be deposited into the openings in the ILD 108 and the ILD 88 using a deposition process such as sputtering, chemical vapor deposition, electroplating, electroless plating, or the like, to fill and/or overfill the openings. Once filled or overfilled, any deposited material outside of the openings may be removed using a planarization process such as chemical mechanical polishing (CMP).

The gate contact 110 is electrically connected to the gate electrode 94 through the silicide layer 105, and the source/drain contacts 112 are physically and electrically connected to the epitaxial source/drain regions 82. FIG. 18B illustrates the gate contact 110 and the source/drain contacts 112 in a same cross-section; however, in other embodiments, the gate contacts 110 and the source/drain contacts 112 may be disposed in different cross-sections. Further, the position of the gate contacts 110 and the source/drain contacts 112 in FIGS. 18A and 18B are merely illustrative and not intended to be limiting in any way. For example, the gate contact 110 may be vertically aligned with the fin 52 as illustrated or may be disposed at a different location above the gate electrode 94. Furthermore, the source/drain contacts 112 may be formed prior to, simultaneously with, or after forming the gate contact 110.

The embodiments of the present disclosure have some advantageous features. The embodiments include the formation of a silicon cap layer over a semiconductor fin in a furnace having a first process temperature that is above 400° C., followed by a ramp down of the first process temperature after the formation of the silicon cap layer wherein at least a first portion of the ramp down after the formation of the silicon cap layer is performed at pressures of 0.1 torr or higher, and a second portion of the ramp down is performed at pressures of 10 torr or higher. In addition, during the second portion of the ramp down the temperature of the furnace drops below 400° C. As a result, the number of defects such as silicon islands or ball type defects formed on dielectric films, dummy fins, and shallow trench isolation (STI) regions surrounding the semiconductor fin that are formed due to silicon migration can be reduced, and a more uniform silicon growth can be achieved. In addition, the diameter of ball type defects formed can be reduced to be below 8 nm. Accordingly, fin morphology is improved, and the risk of performance degradation is lowered.

In accordance with an embodiment, a method includes depositing a first dielectric layer over and along sidewalls of a first semiconductor fin and a second semiconductor fin, where the first semiconductor fin and the second semiconductor fin extend upwards from a semiconductor substrate; depositing a second dielectric layer over the first dielectric layer; recessing the first dielectric layer to expose top surfaces and sidewalls of the first semiconductor fin and the second semiconductor fin and to define a dummy fin between the first semiconductor fin and the second semiconductor fin; forming a cap layer over the top surfaces and sidewalls of the first semiconductor fin and the second semiconductor fin, where the forming the cap layer includes depositing the cap layer in a furnace at process temperatures higher than a first temperature; and lowering the temperature of the furnace, where during the lowering the temperature of the furnace, the pressure in the furnace is raised to and maintained at 10 torr or higher until the temperature of the furnace drops below the first temperature. In an embodiment, the cap layer includes silicon. In an embodiment, the first temperature is 400° C. In an embodiment, the method further includes depositing a third dielectric layer over the second dielectric layer. In an embodiment, the dummy fin includes upper portions of the second dielectric layer and the third dielectric layer. In an embodiment, the method further includes etching portions of amorphous silicon on top surfaces of the first dielectric layer and top surfaces and sidewalls of the dummy fin. In an embodiment, the etching portions of amorphous silicon includes using a wet etch process using HCl or a dry etch process using chlorine gas. In an embodiment, where lowering the temperature of the furnace includes a first portion of lowering the temperature of the furnace, where a pressure of the furnace is in a range from 0.1 torr to 10 torr during the first portion of lowering the temperature of the furnace; and a second portion of lowering the temperature of the furnace after the first portion of lowering temperature of the furnace, where a pressure of the furnace is at or higher than 10 torr during the second portion of lowering the temperature of the furnace. In an embodiment, the lowering the temperature of the furnace includes the furnace having an ambient atmosphere that includes hydrogen, hydrogen radicals, or hydrogen plasma.

In accordance with yet another embodiment, a method includes depositing a first dielectric layer over top surfaces of a substrate and along sidewalls and a top surface of a semiconductor fin, where the semiconductor fin protrudes from a major surface of the substrate; depositing a second dielectric layer and a third dielectric layer over the first dielectric layer; defining a dummy fin adjacent to the semiconductor fin by recessing the first dielectric layer, the dummy fin and the semiconductor fin extending above a top surface of the first dielectric layer, where the dummy fin includes the second dielectric layer and the third dielectric layer; depositing a first semiconductor cap layer over the top surface and sidewalls of the semiconductor fin in a furnace at a temperature that is at or higher than a first temperature; and performing a temperature ramp down process to reduce the temperature of the furnace from the first temperature, the temperature ramp down process including a first portion of the temperature ramp down process, where during the first portion a pressure in the furnace is in a range from about 0.1 torr to about 10 torr; a second portion of the temperature ramp down process, where during the second portion the pressure in the furnace is at 10 torr or higher; and a third portion of the temperature ramp down process, where the pressure of the furnace is lowered from 10 torr or higher. In an embodiment, performing the temperature ramp down process includes the temperature of the furnace dropping below the first temperature during the second portion of the temperature ramp down process. In an embodiment, the first temperature is 400° C. In an embodiment, the method further includes prior to depositing the first semiconductor cap layer depositing a second semiconductor cap layer over the top surface and sidewalls of the semiconductor fin. In an embodiment, depositing the second semiconductor cap layer includes performing a deposition process in the furnace at a second temperature that is lower than the first temperature. In an embodiment, at the end of the third portion of the temperature ramp down process the furnace is at room temperature.

In accordance with yet another embodiment, a method includes depositing a first dielectric layer over a substrate, a first semiconductor fin, and a second semiconductor fin, where the first semiconductor fin and the second semiconductor fin protrude from the substrate; depositing a second dielectric layer and a third dielectric layer over the first dielectric layer; defining a dummy fin extending upwards from the first dielectric layer, where the dummy fin includes the second dielectric layer and the third dielectric layer; forming a semiconductor cap layer on a top and sidewalls of each of the first semiconductor fin and the second semiconductor fin in a furnace, where during the forming the semiconductor cap layer a temperature of the furnace is above 400° C.; and reducing the temperature of the furnace, where during reducing the temperature of the furnace the pressure of the furnace is above 0.1 torr when the temperature of the furnace is above 400° C. In an embodiment, a first material of the first semiconductor fin and the second semiconductor fin and a second material of the semiconductor cap layer are different. In an embodiment, a first carbon concentration of the second dielectric layer and a second carbon concentration of the third dielectric layer are in a range from about 6 percent to about 12 percent by weight. In an embodiment, the semiconductor cap layer includes crystalline silicon. In an embodiment, where the second dielectric layer and the third dielectric layer include SiCN.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a first dielectric layer over and along sidewalls of a first semiconductor fin and a second semiconductor fin, wherein the first semiconductor fin and the second semiconductor fin extend upwards from a semiconductor substrate;
   depositing a second dielectric layer over the first dielectric layer;
   recessing the first dielectric layer to expose top surfaces and sidewalls of the first semiconductor fin and the second semiconductor fin and to define a dummy fin between the first semiconductor fin and the second semiconductor fin;
   forming a cap layer over the top surfaces and sidewalls of the first semiconductor fin and the second semiconductor fin, wherein the forming the cap layer comprises depositing the cap layer in a furnace at process temperatures higher than a first temperature; and
   lowering the temperature of the furnace, wherein during the lowering the temperature of the furnace, the pressure in the furnace is raised to and maintained at 10 torr or higher until the temperature of the furnace drops below the first temperature.

2. The method of claim 1 wherein the cap layer comprises silicon.

3. The method of claim 1, wherein the first temperature is 400° C.

4. The method of claim 1 further comprising depositing a third dielectric layer over the second dielectric layer.

5. The method of claim 4, wherein the dummy fin comprises upper portions of the second dielectric layer and the third dielectric layer.

6. The method of claim 1 further comprising etching portions of amorphous silicon on top surfaces of the first dielectric layer and top surfaces and sidewalls of the dummy fin.

7. The method of claim 6, wherein the etching portions of amorphous silicon comprises using a wet etch process using HCl or a dry etch process using clorine gas.

8. The method of claim 1, wherein lowering the temperature of the furnace comprises:

a first portion of lowering the temperature of the furnace, wherein a pressure of the furnace is in a range from 0.1 torr to 10 torr during the first portion of lowering the temperature of the furnace; and
   a second portion of lowering the temperature of the furnace after the first portion of lowering temperature of the furnace, wherein a pressure of the furnace is at or higher than 10 torr during the second portion of lowering the temperature of the furnace.

9. The method of claim 1, wherein the lowering the temperature of the furnace comprises the furnace having an ambient atmosphere that comprises hydrogen, hydrogen radicals, or hydrogen plasma.

10. A method comprising:
    depositing a first dielectric layer over top surfaces of a substrate and along sidewalls and a top surface of a semiconductor fin, wherein the semiconductor fin protrudes from a major surface of the substrate;
    depositing a second dielectric layer and a third dielectric layer over the first dielectric layer;
    defining a dummy fin adjacent to the semiconductor fin by recessing the first dielectric layer, the dummy fin and the semiconductor fin extending above a top surface of the first dielectric layer, wherein the dummy fin comprises the second dielectric layer and the third dielectric layer;
    depositing a first semiconductor cap layer over the top surface and sidewalls of the semiconductor fin in a furnace at a temperature that is at or higher than a first temperature; and
    performing a temperature ramp down process to reduce the temperature of the furnace from the first temperature, the temperature ramp down process comprising:
    a first portion of the temperature ramp down process, wherein during the first portion a pressure in the furnace is in a range from about 0.1 torr to about 10 torr;
    a second portion of the temperature ramp down process, wherein during the second portion the pressure in the furnace is at 10 torr or higher; and
    a third portion of the temperature ramp down process, wherein the pressure of the furnace is lowered from 10 torr or higher.

11. The method of claim 10, wherein performing the temperature ramp down process comprises the temperature of the furnace dropping below the first temperature during the second portion of the temperature ramp down process.

12. The method of claim 11, wherein the first temperature is 400° C.

13. The method of claim 10 further comprising prior to depositing the first semiconductor cap layer depositing a second semiconductor cap layer over the top surface and sidewalls of the semiconductor fin.

14. The method of claim 13, wherein depositing the second semiconductor cap layer comprises performing a deposition process in the furnace at a second temperature that is lower than the first temperature.

15. The method of claim 10, wherein at the end of the third portion of the temperature ramp down process the furnace is at room temperature.

16. A method comprising:
    depositing a first dielectric layer over a substrate, a first semiconductor fin, and a second semiconductor fin, wherein the first semiconductor fin and the second semiconductor fin protrude from the substrate;
    depositing a second dielectric layer and a third dielectric layer over the first dielectric layer;

defining a dummy fin extending upwards from the first dielectric layer, wherein the dummy fin comprises the second dielectric layer and the third dielectric layer;

forming a semiconductor cap layer on a top and sidewalls of each of the first semiconductor fin and the second semiconductor fin in a furnace, wherein during the forming the semiconductor cap layer a temperature of the furnace is above 400° C.; and reducing the temperature of the furnace, wherein during reducing the temperature of the furnace the pressure of the furnace is above 0.1 torr when the temperature of the furnace is above 400° C.

17. The method of claim 16, wherein a first material of the first semiconductor fin and the second semiconductor fin and a second material of the semiconductor cap layer are different.

18. The method of claim 16, wherein a first carbon concentration of the second dielectric layer and a second carbon concentration of the third dielectric layer are in a range from about 6 percent to about 12 percent by weight.

19. The method of claim 16, wherein the semiconductor cap layer comprises crystalline silicon.

20. The method of claim 16, wherein the second dielectric layer and the third dielectric layer comprise SiCN.

\* \* \* \* \*